(12) United States Patent
Kuznetsov et al.

(10) Patent No.: US 6,933,865 B1
(45) Date of Patent: Aug. 23, 2005

(54) METHOD AND APPARATUS FOR CODED SYMBOL STUFFING IN RECORDING SYSTEMS

(75) Inventors: Alexander Vasilievich Kuznetsov, Pittsburgh, PA (US); Erozan Kurtas, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/767,831

(22) Filed: Jan. 29, 2004

(51) Int. Cl.$^7$ ............................................. H03M 7/00
(52) U.S. Cl. ........................... 341/59; 341/58; 341/67; 341/81
(58) Field of Search .......................... 341/59, 50, 67, 341/81, 58

(56) References Cited

U.S. PATENT DOCUMENTS

| | | | | |
|---|---|---|---|---|
| 5,028,922 A | * | 7/1991 | Huang ........................... | 341/59 |
| 5,233,348 A | * | 8/1993 | Pollmann et al. ............. | 341/67 |
| 5,969,649 A | * | 10/1999 | Ashley et al. ................. | 341/59 |
| 5,999,110 A | * | 12/1999 | Blaum et al. .................. | 341/59 |
| 6,072,410 A | * | 6/2000 | Kim .............................. | 341/59 |
| 6,081,208 A | * | 6/2000 | Kikuchi et al. ................ | 341/50 |
| 6,344,807 B1 | * | 2/2002 | Hassner et al. ................ | 341/59 |

OTHER PUBLICATIONS

Phillips, A.; and Tomizuka, M.; "Multirate Estimation and Control Under Time–Varying Data Sampling with Applications to Information Storage Devices." Proceedings of the American Control Conference, Seattle WA, pp. 4151–4155 (Jun. 1995).

Yamaguchi, K.; and Imai, H.; "Good k/ (k+1) Time–Varying Convolutional Encoders from Time–Invariant Convolutional Codes," 1995 IEEE International Symposium on Information Theory, 1995 Proceedings, pp. 159 (Sep. 17–22, 1995).

Palazzo, Jr. R. "A Time–Varying Convolutional Encoder Better Than the Best Time–Invariant Encoder". IEEE on Information Theory, vol. 39, No. 3, pp. 1109–1110 (May 1993).

B.H. Marcus et al. "Finite–State Modulation Codes for Data Storage." IEEE Journal on Selected Areas in Communications, vol. 10, No. 1, pp. 5–37, (Jan. 1992).

Vucetic, B. "An Adaptive Coding Scheme for Time–Varying Channels." IEEE Transactions on Communications, vol. 39, No. 5, pp. 653–663 (May 1991).

C. D. Heegard et al. "Variable–Length State Splitting with Applications to Average Runlength–Constrained (ARC) Codes," IEEE Transactions on Information Theory, vol. 37, No. 3, pp. 759–777 (May 1991).

(Continued)

*Primary Examiner*—Michael Tokar
*Assistant Examiner*—Lam T. Mai
(74) *Attorney, Agent, or Firm*—Westman, Champlin & Kelly, P.A.

(57) ABSTRACT

A system and method of forming RLL coded data streams with separator blocks has an RLL encoder and a channel encoder. The input code word is divided into data portions and a separator portion. The data portions are inserted into an output codeword without encoding. Each data portion is separated from a next data portion by a space. The separator portion is encoded into non-zero separator sub-matrices, which are stuffed into the spaces between the data portions. The separator portions and the data portions may be separately permuted without exceeding a maximum number of consecutive zeros.

23 Claims, 16 Drawing Sheets

OTHER PUBLICATIONS

Gubner, J.A.; and Hughes, B.L..; "Nonconvexity of the Capacity Region of the Multiple–Access Arbitrarily Varying Channel Subject to Constraints." IEEE Transactions on Information Theory, vol. 41, No. 1, pp. 3–13, (Jan. 1995).

Perez, L.C. "Time Varying Convolutional Codes Revisited," IEEE Information Theory Workshop, pp. 67–69 (Sep. 2–7, 2001).

Ashley, J.; and Marcus, B.; "Time–Varying Encoders for Constrained Systems: An Approach to Limiting Error Propagation," IEEE Transactions on Information Theory, vol. 46, No. 3, pp. 1038–1043 (May 2000).

Ashley, J.; and Marcus, B.; "A Generalized State–Splitting Algorithm," IEEE Transactions on Information Theory, vol. 43, No. 4, pp. 1326–1338 (Jul. 1997).

R. Adler et al. "State Splitting for Variable–Length Graphs," IEEE Transactions on Information Theory, vol. IT–32, No. 1, pp. 108–113 (Jan. 1986).

C. Shalizi et al. "Pattern Discovery in Time Series, Part I: Theory, Algorithm, Analysis, and Convergence." Journal of Machine Learning Research, pp. 1–22 (Jul. 2002).

Monsen, P. "MMSE Equalization of Interference on Fading Diversity Channels," IEEE Transactions on Communications, vol. Com–32, No. 1, pp. 5–12 (Jan. 1984).

J. Coker et al. "Noise–Predictive Maximum Likelihood (NPML) Detection," IEEE Storage Systems Division, IEEE Transactions on Magnetics, vol. 34, No. 1, pp. 110–117 (Jan. 1998).

Moon, J.; and Park, J.; "Pattern–Dependent Noise Prediction in Signal–Dependent Noise," IEEE Journal on Selected Areas in Communications, vol. 19, No. 4, pp. 730–743 (Apr. 2001).

Kavcic, A.; and Moura, J.; "The Viterbi Algorithm and Markov Noise Memory," IEEE Transactions on Information Theory, vol. 46, No. 1, pp. 291–301 (Jan. 2000).

P. CharnKeitKong et al. "On Classes of Rate k/ (k+1) Convolutional Codes and Their Decoding Techniques," IEEE Transactions on Information Theory, vol. 42, No. 6, pp. 2181–2193 (Nov. 1996).

* cited by examiner $n_1 = 2$    $n_2 = 2$    $n_3 = 2$

| 0 | 1 | 0 | 1 | 0 | 1 |
|---|---|---|---|---|---|
| 0 | 1 | 0 | 1 | 1 | 0 |
| 0 | 1 | 0 | 1 | 1 | 1 |
| 0 | 1 | 1 | 0 | 1 | 0 |
| 0 | 1 | 1 | 0 | 1 | 1 |
| 0 | 1 | 1 | 1 | 0 | 1 |
| 0 | 1 | 1 | 1 | 1 | 0 |
| 0 | 1 | 1 | 1 | 1 | 1 |

METHOD AND APPARATUS FOR CODED SYMBOL STUFFING IN RECORDING SYSTEMS

CROSS-REFERENCE TO RELATED APPLICATION(S)

None.

BACKGROUND OF THE INVENTION

The present invention relates to data storage and retrieval systems. More particularly, the present invention relates to a method and apparatus for coded symbol stuffing in optical and magnetic recording systems where run length limiting coding schemes are used.

Generally, both data storage/retrieval systems and data transmission systems communicate information. Storage/retrieval systems communicate information through time, while data transmission systems communicate information through space. Typically, data storage and retrieval systems use a read/write head to communicate data to a corresponding one of substantially concentric tracks or channels in the media Using various modulation techniques, data transmission systems similarly communicate data over channels in the transmission media or receive data from channels in the media. Storage/retrieval systems and data transmission systems often utilize encoding/decoding schemes for error detection, for privacy, and for data compression.

One common type of coding scheme is referred to as Run Length Limiting. Run length limiting encoding schemes involve separating consecutive "1s" in a binary sequence by some predefined number of zeros. Coded data sequences having this property are referred to as Ran Length Limited (RLL) codes.

Conventional systems that utilize RLL coding schemes, such as optical and magnetic storage systems, as well as in some communication systems, typically include an outer error correcting code (ECC), and a run length limiting (RLL) encoder. Such systems may also include an optional inner channel encoder. Data is encoded first by the ECC, then passed through the RLL encoder. If the optional inner channel encoder is used, the RLL encoded data is then passed through the inner channel encoder. The output of either the RLL encoded data or the inner channel encoded data can then be precoded before being recorded onto channels on the media.

Typically, at the detection side, a Viterbi detector is used to reconstruct the coded bits from the channel; however, due to electronic and media noise in the channel, conventional detectors cannot recover the original data with an arbitrarily small error probability. To correct errors after the coded bits are reconstructed by the Viterbi detector, an ECC decoder is used at the output of the read/write channel. Generally, the ECC decoder decreases the output Bit-Error Rate (BER) and the Sector Failure Rate (SFR) of the channel to the levels typically provided in the technical specifications for the implementing apparatus.

It is known that the RLL code typically facilitates the operation of the timing circuits. At the same time, the RLL code shapes the spectrum of the signal and modifies the distance properties of the output code words of the channel. Since the RLL code effects both the shape of the signal spectrum and the distance properties of the output, the RLL code can be used to improve the BER and the SFR characteristics of the system.

Conventional RLL coding schemes employ a state transition diagram. In a finite state encoder, arbitrary user data (p) is encoded to constraint data (q) via a finite state machine, where p and q represent sequences of data objects, each containing two or more elements. The data rate of the encoder can be defined as p/q ("p divided by q"), provided that, at each stage of the encoding process, one P-object of user data (p) is encoded to one q-object of constraint data (q) in such a way that the concatenation of the encoded q-objects obeys the given constraint.

The finite-state machine has multiple states, and the encoder or decoder moves from one state to another after the generation of each output object. A single error in the received sequence can trigger the generation of wrong states in the decoder, resulting in long sequences of errors. This phenomenon is referred to as error propagation.

It is expected that the received sequence to be decoded will not be identical to the transmitted sequence due to a variety of factors, such as inter-symbol interference (ISI), damage to the storage medium, noise, and the like. These factors lead to errors in the decoded sequence, and the decoder must account for these errors. For the purpose of limiting error propagation, the decoder can be implemented via a sliding-block decoder, which is a decoder having a decoding window of a fixed size. The encoded data sequence is decoded a portion at a time, such that recovery of a specific original bit involves only a portion of the received sequence. Specifically, the portion of the received sequence being decoded is the portion of the sequence that falls within the decoding window of the specific bit. Thus, the decoding process can be considered as a sequence of decoding decisions where the decoding window "slides" over the sequence to be decoded. The sliding block decoder limits errors in the received sequence such that the error only influences the decoding decisions made within the window, thereby effecting only a limited number of recovered bits.

The size of the decoding window of a sliding block decoder is relatively significant. The size of the window provides an upper bound to the expected amount of error propogation and it provides an indication of the complexity of the decoder (and the corresponding size of the decoder's hardware implementation).

One technique for constructing finite state encoders is the state-splitting algorithm, which reduces design procedure a series of steps. As a design technique, the state-splitting algorithm works well for small and moderate values of p, but when p is relatively large, the state-splitting algorithm encounters simply too many possible assignments of data-to-codeword in the encoding graph, making design difficult. Moreover, a poor choice of assignments, given the complexity, could lead to a costly implementation. In practice, the implemented design should include the fewest possible number of states. However, the state-splitting algorithm does not directly solve the general problem of designing codes that achieve, for example, the minimum number of encoder states, the smallest sliding-block decoding window, or the minimum hardware complexity (a less precise valuation).

Recently, various types of iterative detection and decoding schemes were developed for use in data storage and data communication systems, based on turbo codes, Low Density Parity Check (LDPC) codes, and turbo product codes. These types of codes provide very low BERs, but they usually require the use of an interleaver after the RLL and optional inner channel encoder(s). An interleaver changes the order of the bits in a sequence. By processing the already encoded bits with an interleaver, the interleaver changes the order of the already encoded bits, which can effectively nullify the operation of the RLL encoder. Since encoders based on finite-state machines transform all (or almost all) data bits while generating the output code words, the use of such codes in channels with interleaving coded bits is virtually impossible, or at least severely restricted.

BRIEF SUMMARY OF THE INVENTION

A method of forming RLL coded data streams uses separator blocks to limit consecutive zeros to a predetermined maximum. An input code word is divided into data portions and a separator portion. Each data portion is inserted into an output codeword without encoding and separated from a next data portion by a space. The separator portion is encoded into non-zero separator sub-matrices, which are stuffed into the spaces between the data portions. The separator portion and the data portions may be separately permuted without violating a constraint on consecutive zeros in the output.

BRIEF DESCRIPTION OF THE DRAWINGS

FIG. 3 is an illustrative example of the separator matrix used by the m/n encoder to generate nonzero separators stuffed in the uncoded data stream.

While the above-identified illustrations set forth preferred embodiments, other embodiments of the present invention are also contemplated, some of which are noted in the discussion. In all cases, this disclosure presents the illustrated embodiments of the present invention by way of representation and not limitation. Numerous other minor modifications and embodiments can be devised by those skilled in the art which fall within the scope and spirit of the principles of this invention.

DETAILED DESCRIPTION OF PREFERRED EMBODIMENTS

Figure 1:
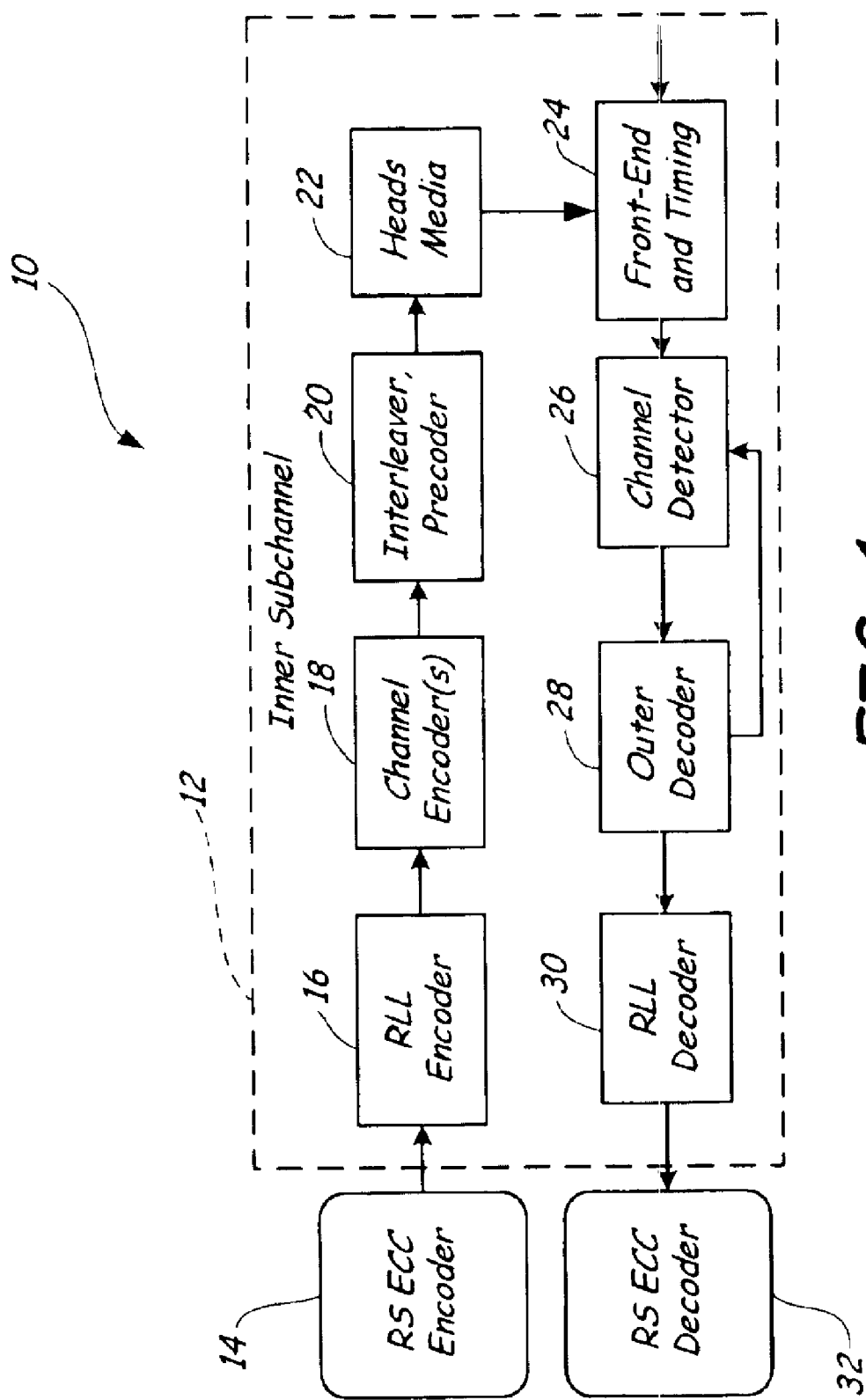
FIG. 1 is a block diagram illustrating a read channel architecture in which the embodiments of the present invention can be implemented.

FIG. 1 illustrates a read/write channel of magnetic and/or optical disc drives. As shown, the system 10 reads and writes data to an inner subchannel 12 of the magnetic and/or optical disc of the disc drive. The system has an Reed-Solomon (RS) Error Correction Code (ECC) encoder 14, a Run Length Limited (RLL) encoder 16, a channel encoder(s) 18, an Interleaver precoder 20, head media 22, front end and timing element 24, a channel detector 26, an outer decoder 28, an RLL decoder 30 and an RS ECC decoder 32.

Generally, RS codes are linear block codes, meaning that they can be processed all at once as blocks of data. The RS algorithm takes data words, splits them up into code words, and adds redundant parity bytes in order to correct symbol errors. RS codes are written as RS(N, K) where there are k data symbols in each n symbol codeword. This means that there are N-K parity symbols in each codeword and the RS algorithm can correct up to (N-K)/2 symbol errors in each codeword.

The RLL codes are codes that are limited by the number of flux changes that can be written in a given amount of disc area. In other words, RLL techniques limit the distance (run length) between magnetic flux reversals on the discs surface. By limiting the run length, the RLL coding technique defines the size of the data block that can be written within a given amount of disc space.

When data is presented to the system 10 for transmission over the inner subchannel 12, the RS ECC encoder 14 encodes the data and passes the RS encoded data to an RLL encoder 16. The RLL encoder encodes the RS encoded data and passes the RLL encoded data to a channel encoder 18. The channel encoder 18 encodes the RS encoded data for the channel 12 and passes the encoded data to an interleaver precoder 20, which reorders the coded data. Finally, the head media 22 writes the data to the inner subchannel 12.

Encoded data is read from the inner subchannel 12 of the disc by the heads media block 22. The encoded data is then processed by some analog filters, such as a preamp (preliminary amplifier), a low pass filter (LPF) and other elements, a process that is sometimes referred to as "front-end processing". The filtered signal is then sampled using timing circuitry. In FIG. 1, the filtering and sampling elements are indicated by the front end and timing element 24.

The data is then passed to a channel detector 26 and to an outer decoder 28. The outer decoder 28 decodes the encoded data into RLL encoded data The RLL encoded data is then decoded by the RLL decoder 30 and passed to an RS ECC decoder 32 for decoding into the originally transmitted data.

The read/write channels of magnetic and/or optical disc drives include a number of different encoding/decoding circuits, each encoding or decoding data in different manners for different purposes. The various circuits shown in the blocks of FIG. 1 can be implemented as integrated circuits, discrete components, or suitably programmed processing circuitry. Additionally, while the discussion has included references to head media, other devices may be utilized to write data to a channel and to read data from the channel, such as a transceiver.

In general, the system 10 utilizes a combinatorial object called a separator matrix S, for stuffing separator bits between coded bits of the input data word. The separator matrix S is a matrix of size L×m and consists of binary elements 0 and 1. Generally, the separator matrix S is defined by two sets of positive integer parameters:

$$n_1, n_2, \ldots, n_l, \text{ and}$$

$$v_0, v_1, \ldots, v_l.$$

where $n = n_1 + n_2 + \ldots + n_l$.

Figure 2:
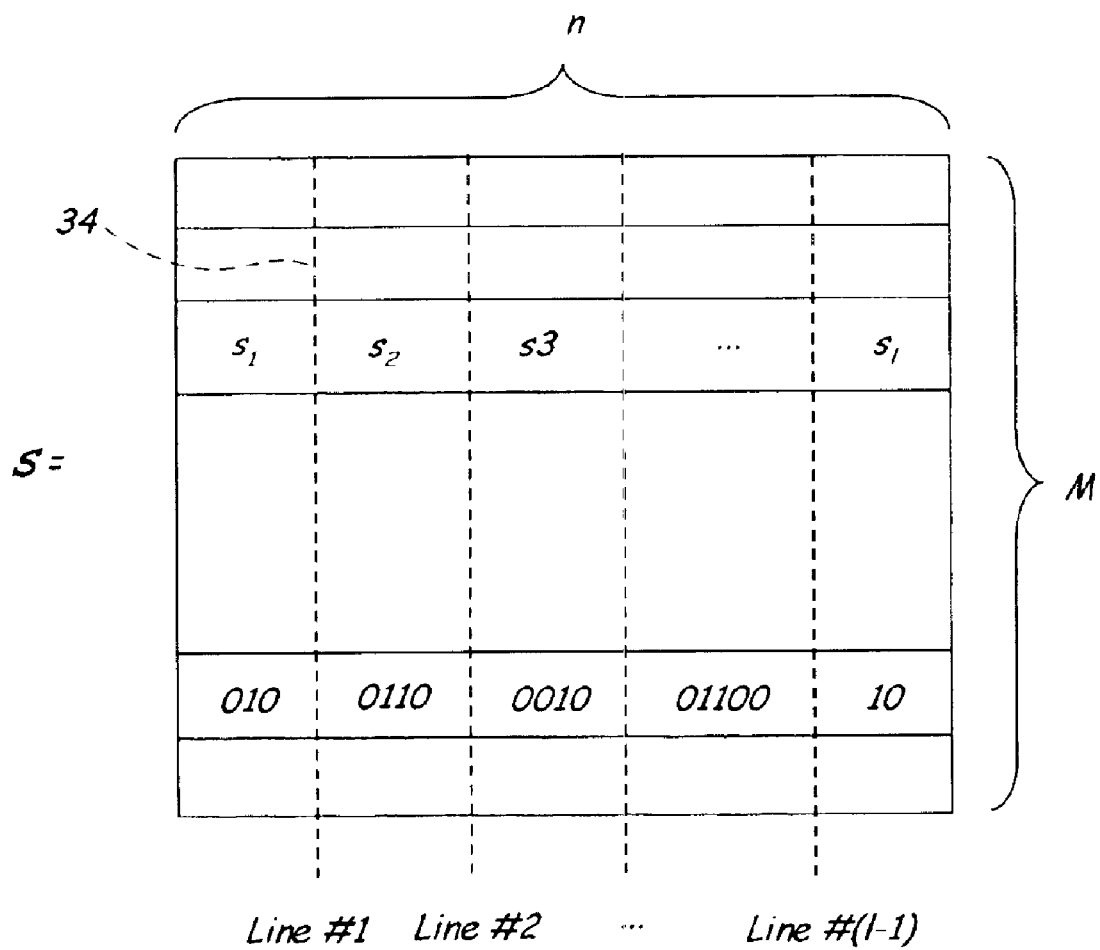
FIG. 2 is a generic separator matrix used by the m/n encoder to generate nonzero separators stuffed in the uncoded data stream.

FIG. 2 shows the generic structure of the separator matrix S. As shown, the matrix S is partitioned by l−1 boundaries 34 into l submatrices $S_1, S_2, \ldots, S_l$ of size $L \times n_1, L \times n_2, \ldots, L \times n_l$, respectively. The matrix S is called the $(v_0, v_1, \ldots, v_l)$-separator matrix if 1) each submatrix $S_i$, of $1 \leq i < l$ consists of nonzero rows, or in other words each row of S consists of l nonzero separators $s_1, s_2, \ldots, s_l$; 2) each line of S has at most $v_0$ consecutive leading zeros, and at most $v_1$ consecutive trailing zeros; and 3) each line of S has at most $v_i$ consecutive leading zeros at the i-th boundary $1 \leq i < l-1$. Specifically, in each row of the matrix S, the total number of consecutive zeros at the left and right sides of the i-th dotted vertical line is not greater than $v_i$, and this inequality is satisfied at all l−1 boundaries and for all rows of the separator matrix.

FIG. 3 illustrates an embodiment of the separator matrix S. In this embodiment, the separator matrix S has the following parameters:

M=8, n=6, l=3, where M is the number of rows, n is the number of columns, and l is the number of separators in each row. Each code word ($n_1$, $n_2$, and $n_3$) has two bits, and $v_0 = v_1 = v_2 = v_3 = 1$.

Figure 4:
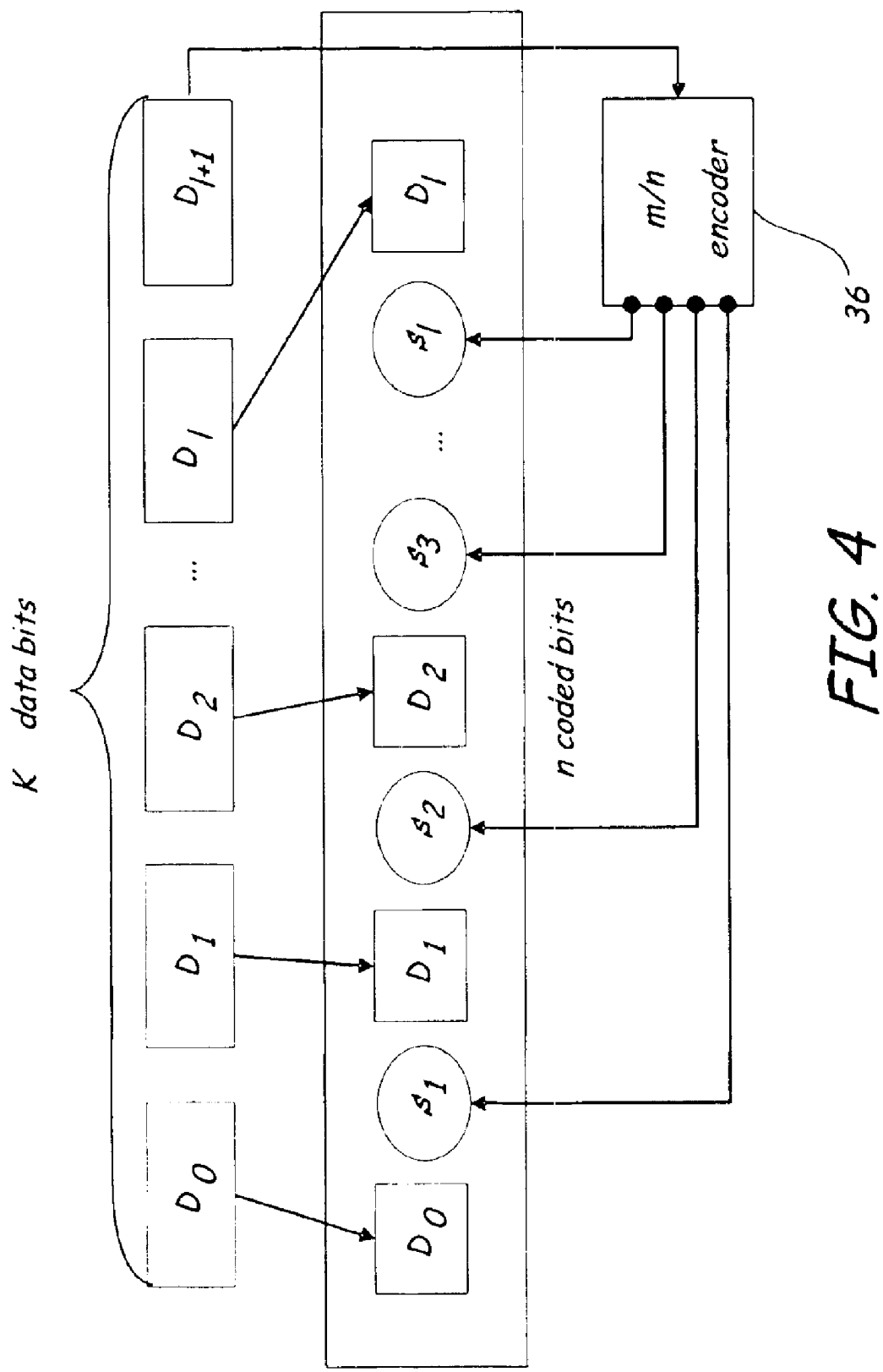
FIG. 4 is the block diagram illustrating the principle of the coded bit stuffing providing the k-constraint.

A generic RLL encoding scheme using the $(v_0, v_1, \ldots, v_l)$-separator is constructed as follows. First, the input data word consisting of N bits is split into l+2 parts $D_0, D_1, \ldots, D_{l+1}$ of lengths $N_0, N_1, \ldots, N_{l+1}$, respectively. The first l+1 data parts $D_0, D_1, \ldots, D_{l+1}$ are placed directly into the output code word without encoding as shown in FIG. 4.

The last data part $D_{l+1}$ is sent to the m/n encoder 36 that converts m input bits into one of the rows of the separator matrix S. Thus, the output of the m/n encoder is a binary word of length n. It consists of l separators $s_1, s_2, \ldots, s_l$ of length $n_1, n_2, \ldots, n_l$, respectively, and created by the boundary lines 34 shown in FIG. 2.

Finally, the output of the m/n encoder is split into parts, which are then stuffed between the first l+1 data parts in the output code word. The resulting n coded bits satisfy the k-constraint, which requires no more than k consecutive zeros in the bit sequence.

With this encoding technique, the maximum number of consecutive zeros between any two consecutive ones in a coded sequence is not greater than 1) $N_1 + v_0 + v_{l+1} + N_0$ (at the left and right boundaries of the codeword); 2) $v_i + N_i$ (between separator components $s_i$ and $s_{i+1}$, $1 \leq i < l$); or 3) $k_0$ (the maximum number of consecutive zeros within the separators $s_i$). Here, $k_0$ is less than $n_i - 2$, where i is greater than 1 and less than l (e.g. $1 \leq i < l$). When the lengths $n_i$ are small numbers, the constraint $k_0$ is usually defined only by the first two conditions given above.

By separating the data bits with coded data (e.g. by "code stuffing"), bit errors are contained between separator blocks. More specifically, bit errors are prevented from propagating throughout the bit sequence, thereby minimizing transmission errors by limiting them to a particular block. In this instance, an error in encoded block si would effect only the subblock $s_i$, but not the data blocks $D_i$.

Figure 5:
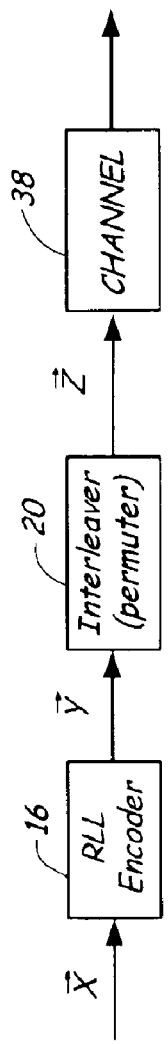
FIG. 5 is the block diagram illustrating operations of the RLL encoder and permuter.

FIG. 5 illustrates an embodiment of the system 10 having an RLL encoder 16, an Interleaver (permuter) 20, and a channel 38. As shown, input word $\vec{x}$ is passed to the RLL encoder 16. The RLL encoder 16 encodes the input word $\vec{x}$ into an RLL encoded word $\vec{y}$. The RLL encoded word $\vec{y}$ is then passed to the Interleaver (permuter) 20, which produces an output word $\vec{z}$. The output word $\vec{z}$ is then passed onto the channel 38. The channel 38 may be the inner subchannel 12 (as shown in FIG. 1), a communication link between a transmitter and a receiver, or any kind of communication or transmission channel, including magnetic recording channels.

Generally, the permuter 20 changes the positions of the components in $\vec{y}$ in a random manner to facilitate the operation of iterative detection scheme shown in FIG. 1. Additionally, the permuter 20 must preserve the operation of the RLL encoder 16. Specifically, the permuter 20 operates in the subblocks rather than on the entire codeword all at once. In this way, the resulting output sequence $\vec{z}$ satisfies the same or similar constraints as its input sequence $\vec{y}$.

The RLL encoder 16 produces the following output sequence:

$$\vec{y} = [D_0, s_1, D_1, S_2, \ldots, s_l, D_l],$$

where $$D_0 = [x_1, x_2, \ldots, x_{N_0}],$$

$$D_1 = [x_{N_0+1}, x_{N_0+2}, \ldots, x_{N_0+N_1}], \text{ and}$$

$$D_1 = [x_{N_0+\ldots+N_1+1}, x_{N_0+\ldots+N_1+2}, \ldots, x_{N_0+\ldots+N_l+Vl+1}]$$

are the uncoded blocks of the input data sequence $\vec{x}$, and $$\vec{s} = [s_1, s_2, \ldots, s_l]$$

is the output of the m/n-encoder, which converts the last m user bits $$D_1 = [x_{N_0+\ldots+N_1+1}, x_{N_0+\ldots+N_1+2}, \ldots, x_{N_0+\ldots+N_l+Vl+1}]$$

to the nonzero separators $\{s_1, 1 \leq i \leq l\}$.

The structure and properties of the output codeword $\vec{y}$ allows the permuter 20 to preserve the k-constraint at its output while performing permuting operations, such as swapping any two data blocks ($D_i$ and $D_j$) within the output codeword $\vec{y}$ without shifting the boundaries between the two data blocks if $D_i$ and $D_j$ have the same length or swapping any two separators $s_i$ and $s_j$ in $D_0 = [x_1, x_2, \ldots,$ $x_{N_0}$] without shifting boundaries between blocks if $s_i$ and $s_j$ have the same length.

Figure 6:
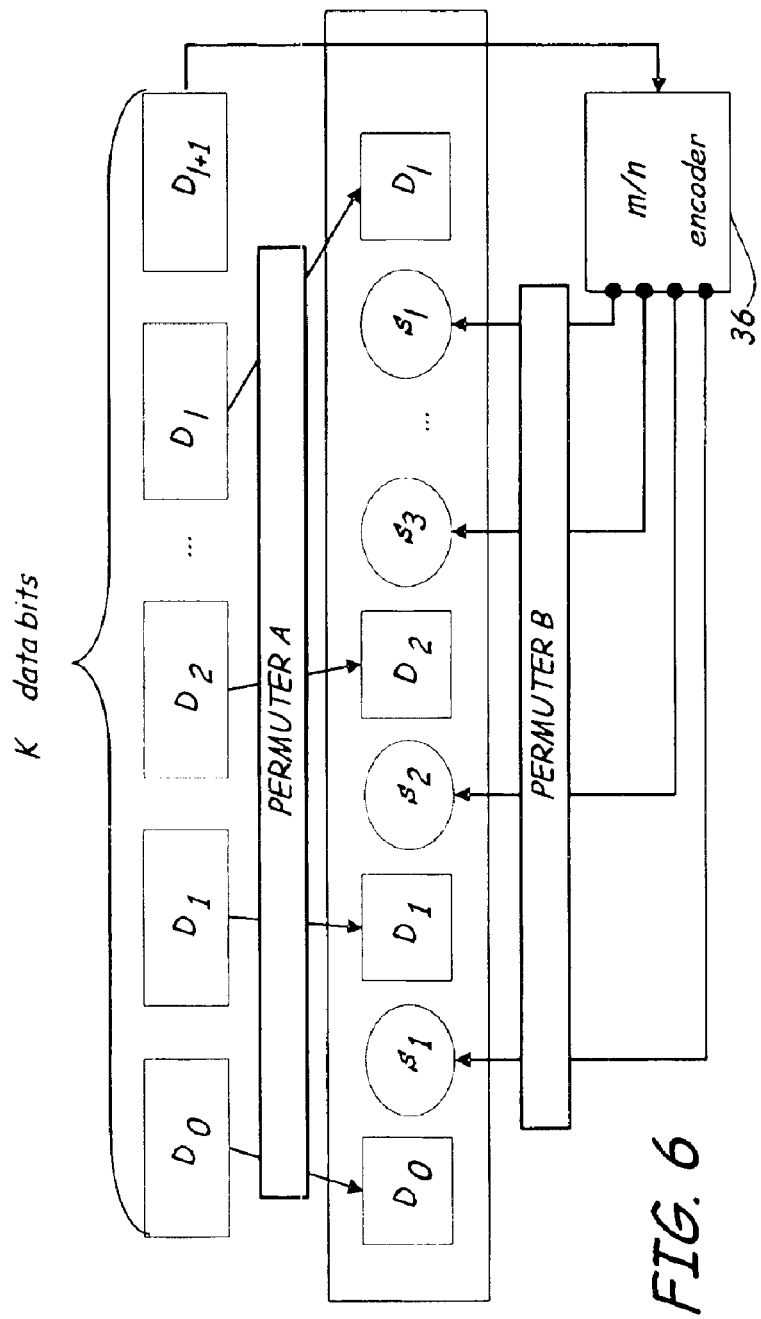
FIG. 6 is the block diagram illustrating the principle of the coded bit stuffing combined with data interleaving (permutation).

As shown in FIG. 6, K data bits 40 are passed through permuter A 42 (for the first l data bits) and through permuter B 44 (for the l+1 data bit) to produce the output codeword 46. When the RLL encoder 16 performs swapping operations, the permuter A 42 swaps data blocks $D_i$, and permuter B 44 swaps the separators $s_i$. Thus, none of these swapping operations changes the k-constraint provided by the RLL encoder 16. Thus, the k-constraint is preserved in the proposed scheme combining the RLL encoder 16 and permuter 20.

A number of pseudo-random and structured permuters are capable of separately shifting the data blocks and the separator blocks in an encoded bit sequence, so as to encode the signal without unwanted shuffling of the coded bits. Thus, the technique can be used in the magnetic recording channels, and other storage and communication systems facilitating the operations of the iterative detection schemes with soft decisions, such as Turbo codes, Low Density Parity Check (LDPC) codes and Turbo-Product Codes (TPC).

Figure 7:
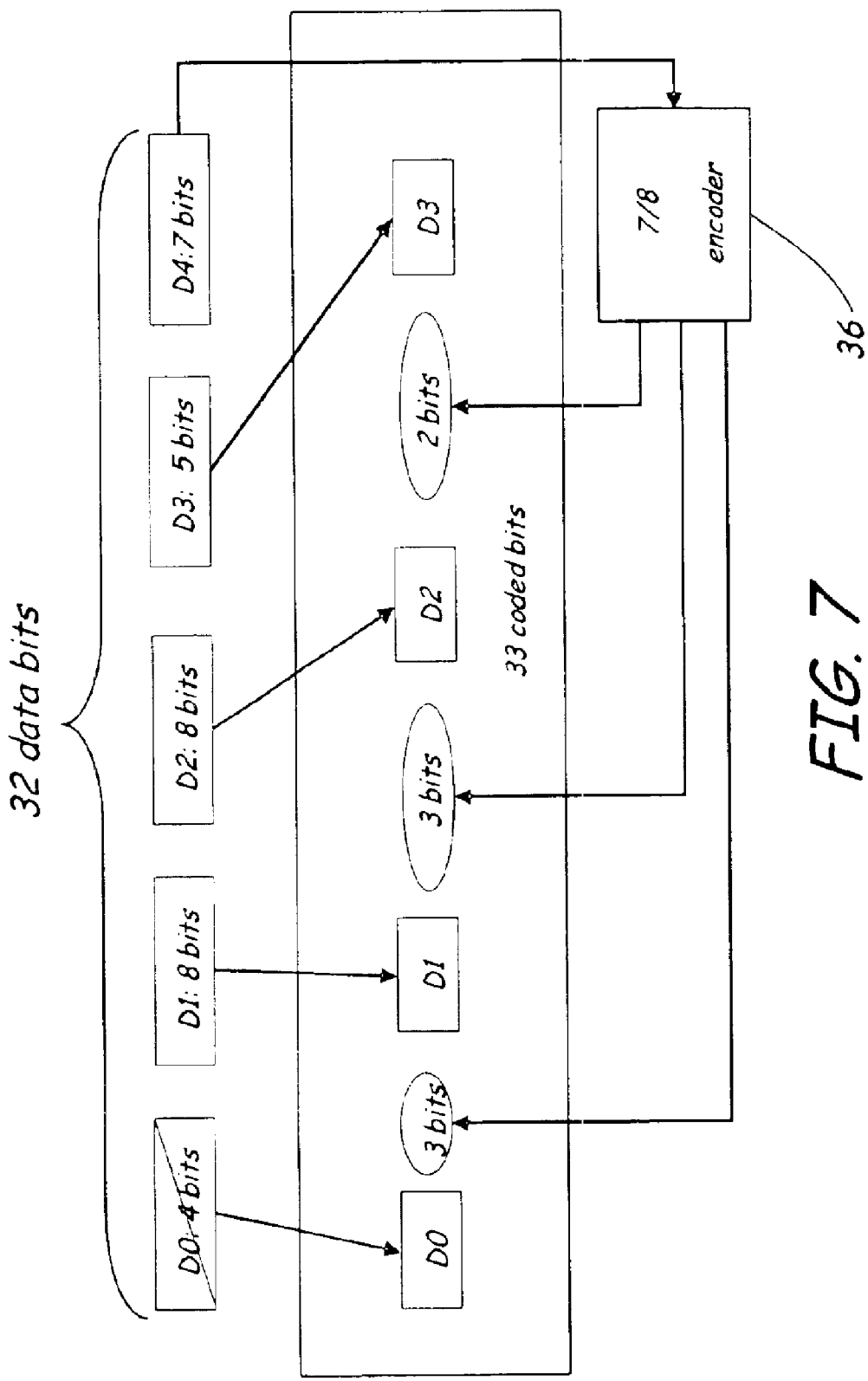
FIG. 7 is the block diagram illustrating the implementation of the 32/33 RLL code with k=12 constructed by stuffing of 3 separators in the data stream.

FIG. 7 illustrates a RLL encoder 16 with a code rate of 32/33 and a k-constraint of k=12. In other words, FIG. 7 shows a (0,12) RLL code with rate 32/33. In this embodiment, the input word of the RLL encoder consists of four bytes and is encoded into a code word of length 33.

As shown, the 32 data bits are split into five parts $D_i$ (specifically $D_0$, $D_1$, $D_2$, $D_3$, and $D_4$) of lengths $N_i$ ($N_0$=4, $N_1$=8, $N_2$=8, and $N_3$=5), a (m=$N_4$=7), respectively. The first four data parts are directly placed in the output code word without encoding. The last 7 data bits $D_4$ are sent to the 7/8 encoder 36. The output of the 7/8 encoder 36 is three nonzero separators $s_1$, $s_2$, and $s_3$ of lengths $n_1$=3, $n_2$=3 and $n_3$=2, respectively. In this case, the first twenty four data bits are placed in the output code word without encoding at positions 0–3, 7–14, 18–25 and 29–33, respectively. The separators $s_1,s_2,s_3$ are inserted between the uncoded data parts $D_0$, $D_1$, $D_2$, and $D_3$ at positions 4–6, 15–17, and 26–28, respectively.

None of the separators $s_1,s_2,s_3$ consists of all zeros. Specifically, separators $s_1$ and $s_2$ take nonzero values from the following range of values: (0,0,1); (0,1,0); (0,1,1); (1,0,0); (1,0,1); (1,1,0); and (1,1,1). Separator $s_3$ takes a nonzero value from the following range of values: (0,1); (1,0); and (1,1). Thus, there are 147 words (7×7×3=147) of length 8, which can be used as output codewords of the 7/8 encoder 36.

In this example, the maximum number of consecutive zeros in the coded bit stream is not greater than 12. At the left boundary, data block $D_0$ has 4 bits (4 possible zeros) and separator bit $s_1$ has 3 bits (2 possible zeros). At the right boundary, data block $D_3$ has 5 bits (5 possible zeros) and separator block $s_3$ has 2 bits (1 possible zero). Thus, the maximum number of consecutive zeros at the boundaries is 12.

Between $s_1$, and $s_2$, the maximum number of consecutive zeros is also 12, corresponding to the 2 possible zeros from each of $s_1$ and $s_2$, and the eight bits (8 possible zeros) associated with data block $D_1$. Between $s_2$ and $s_3$, the maximum number of consecutive zeros is 11, corresponding to the 2 possible zeros from $s_2$, the two bits (1 possible zero) from $s_3$, and the eight bits (8 possible zeros) associated with $D_2$. Therefore, the constructed code has the parameter k=12.

This example demonstrates that an additional bit could be included without altering the zero constraint k. Specifically, by including an extra data bit in the part $D_2$, it is possible to increase the length of the output code by one bit, resulting in a 33/34 RLL code with k=12 for all portions of the data stream.

The 7/8 encoder/decoder can be implemented based on simple integer arithmetic. For example, each input bit u=($u_0$, $u_1$, ..., $u_6$) of the 7/8 encoder can be represented as an integer I=0, 1, 2, ..., 127, using the following equality:

$$I = i(u) = \sum_{i=0}^{6} u_i \cdot 2^{6-i}$$

As discussed above, there are 147 possible output words of length 8 with three nonzero separators $s_1$, $s_2$, and $s_3$, and any 127 of them can be used to encode the final seven input data bits.

To form the encoder, let delta ($\Delta$) be a predefined constant ($0 \leq \Delta \leq 20$), and J=I+$\Delta$. In this example, the integer J satisfies the following inequality:

$$\Delta \leq J \leq 127+\Delta < 147.$$

By altering the parameter delta ($\Delta$) within the defined range, it is possible to produce 21 different versions of the encoder using the following encoding steps.

| Encoding Step 1. | | |
|---|---|---|
| $s_1$ = (001), | h = J, | if 0 ≤ J < 21; |
| $s_1$ = (010), | h = J − 21, | if 21 ≤ J < 42; |
| $s_1$ = (011), | h = J − 42, | if 42 ≤ J < 63; |
| $s_1$ = (100), | h = J − 63, | if 63 ≤ J < 84; |
| $s_1$ = (101), | h = J − 84, | if 84 ≤ J < 105; |
| $s_1$ = (110), | h = J − 105, | if 105 ≤ J < 126; and |
| $s_1$ = (111), | h = J − 126, | if 126 ≤ J < 147; |
| Encoding step 2. | | |
| $s_2$ = (001), | g = h, | if 0 ≤ h < 3; |
| $s_2$ = (010), | g = h − 3, | if 3 ≤ h < 6; |
| $s_2$ = (011), | g = h − 6, | if 6 ≤ h < 9; |
| $s_2$ = (100), | g = h − 9, | if 9 ≤ h < 12; |
| $s_2$ = (101), | g = h − 12, | if 12 ≤ h < 15; |
| $s_2$ = (110), | g = h − 15, | if 15 ≤ h < 18; and |
| $s_2$ = (111), | g = h − 18, | if 18 ≤ h < 21 |
| Encoding step 3. | | |
| s3 = (01), | if g = 0; | |
| s3 = (10), | if g = 1; and | |
| s3 = (11), | if g = 2. | |

The decoding algorithm for the 7/8 decoder is constructed as follows.

Decoding step 1.

Given codewords ($c_1$, $c_2$, and $c_3$), the integer J is reconstructed using the following equality:

$$J=21*i(s_1)+3*i(s_2)+i(s_3),$$

where i(s) is an integer represented by the binary word $S_i$.

Decoding step 2.

Subtracting $\Delta$ from J gives the integer I. The binary representation of I is then sent to the output of the decoder (7 bits).

The 7/8 encoder/decoder described below effectively suppresses error propagation. To encode data using the 7/8 encoder 36, first the input data bits are split into three parts (a, b, and c) of lengths 3 bits, 3 bits and 1 bit, respectively. The input of the 7/8 encoder is a, b, and c. The output 8 bits are also represented by three parts ($s_1$, $s_2$, and $s_3$) of length 3 bits, 3 bits, and 2 bits. The output 8 bits are calculated as follows.

Case 1. If $a \neq 0$ and $b \neq 0$, then
a) $s_1 = a$;
b) $s_2 = b$; and
c) $s_3 = (c, \bar{c})$.
where $\bar{c}$ is the binary compliment of c.
Case 2. If $a \neq 0$ and $b = 0$, then
a) $s_3$ (1,1); and
b) $s_1 = a$ and $s_2 = (010)$, if $c = 0$; or
c) $s_1 = a$ and $s_2 = (001)$, if $c = 1$.
Case 3. If $a = 0$ and $b \neq 0$, then
a) $s_3 = (1,1)$, and
b) $s_1 = (010)$, $s_2 = b$, if $b \notin \{(001),(010)\}$ and $c = 0$,
c) $s_1 = (001)$, $s_2 = b$, if $b \notin \{(001),(010)\}$ and $c = 1$,
d) $s_1 \in \{(100),(011)\}$, $s_2 = (011)$, if $b = (001)$; or
e) $s_1 \in \{(110),(101)\}$, $s_2 = (011)$, if $b = (010)$.
Case 4. If $a = 0$ and $b = 0$, then
a) $s_3$ (1,1), and
b) $s_1 = (100)$, $s_2 = (100)$, if $c = 0$; and
c) $s_1 = (011)$, $s_2 = (100)$, if $c = 1$.

To decode a received encoded signal, the 7/8 encoder/decoder 36 divides the input codeword into three parts ($s_1$, $s_2$, and $s_3$) having 3 bits, 3 bits and 2 bits, respectively. The output codewords of the decoder 36 consist of three parts $\hat{a}$, $\hat{b}$ and $\hat{c}$ of lengths 3 bits, 3 bits and 1 bit, respectively. The output codewords are calculated as follows.

Case 1 (7/8 Decoder). If $s_3 \in \{(01),(10)\}$, then
a) $\hat{a} = s_1$,
b) $\hat{b} = s_2$, and
c) $\hat{c}$ is equal to the first component of $s_3$.

Case 2 (7/8 Decoder). If $s_3 = (1,1)$ and $s_2 \in \{(001),(010)\}$, then
a) $\hat{a} = s_1$,
b) $\hat{b} = (000)$, and
c) $\hat{c}$ is equal to the last component of $s_2$.

Case 3 (7/8 Decoder). If $s_3 = (1,1)$, $s_2 \notin \{(001),(010)\}$, but $s_1 \in \{(001),(010)\}$ then
a) $\hat{a} = (000)$,
b) $\hat{b} = s_2$, and
c) $\hat{c}$ is equal to the last component of $s_1$.

Case 4 (7/8 Decoder). If $s_3 = (1,1)$, $s_2 = (011)$, and $s_1 \notin \{(001),(010)\}$ then
a) $\hat{a} = (000)$,
b) $\hat{b} = (001)$, if $s_1 \in \{(100),(011)\}$, or
c) $\hat{b} = (010)$, if $s_1 \in \{(110),(101)\}$, and
d) $\hat{c}$ is equal to the last component of $s_1$.

Case 5 (7/8 Decoder). If $s_3 = (1,1)$, $s_2 = (100)$, and $s_1 \in \{(100),(011)\}$ then
a) $\hat{a} = (000)$,
b) $\hat{b} = (000)$, and
c) $\hat{c}$ is equal to the last component of $s_1$.

Thus, the system 10 divides the input codeword into several parts, each part being composed of data bits. The last part is passed to the 7/8 encoder/decoder 36, which utilizes the last portion of the input codeword to generate separator codes for stuffing between the other parts, which are inserted into the output codeword without encoding. The resulting output codeword is constrained such that the maximum number of consecutive zeros is determined by the k-constraint. Here, no more than 12 consecutive zeros is possible.

Figure 8:
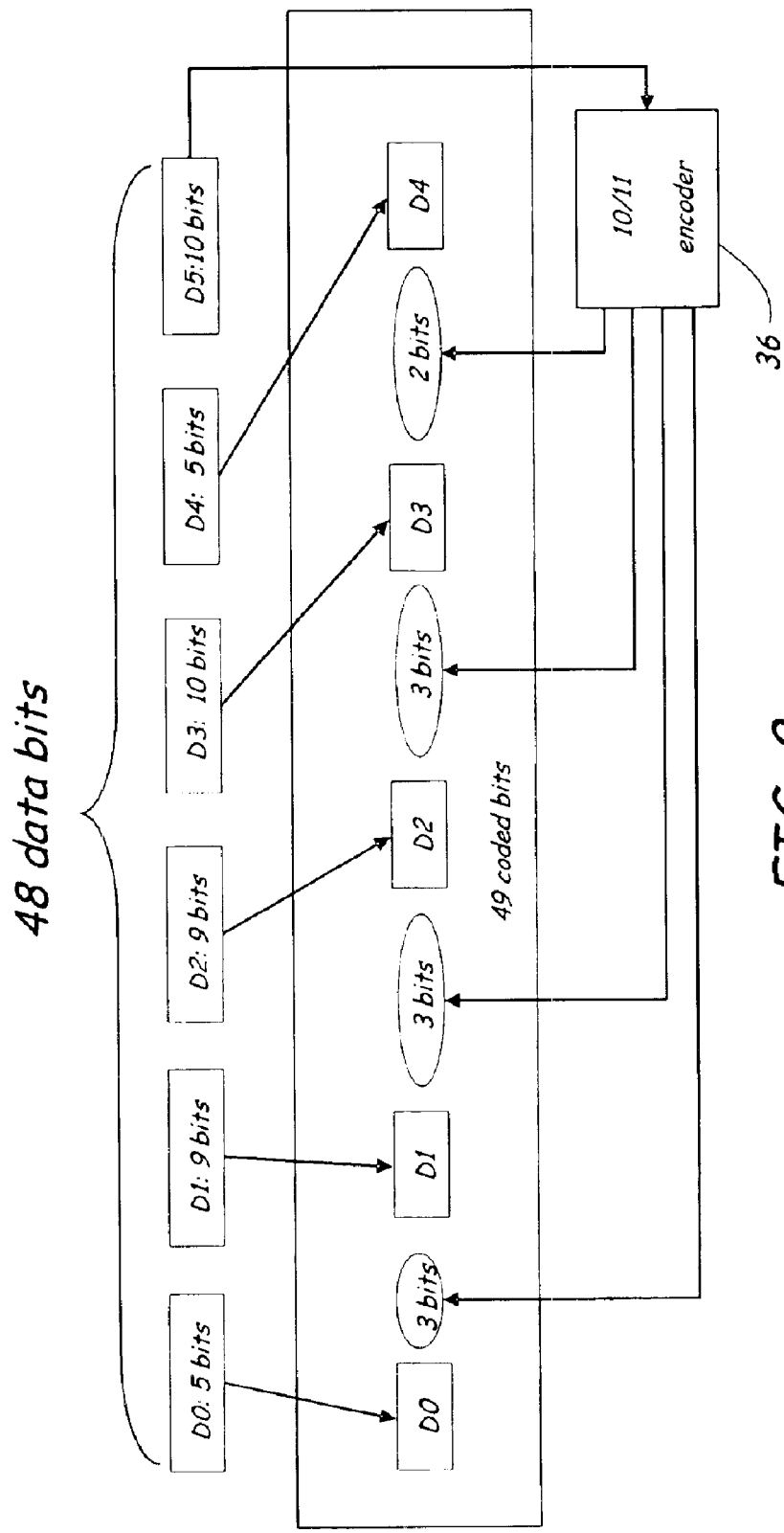
FIG. 8 is the block diagram illustrating the implementation of the 48/49 RLL code with k=13 constructed by stuffing of 4 separators in the data stream.

In FIG. 8, a (0,13) RLL code with rate 48/49 is illustrated. In this instance, the input codeword of the encoder 36 consists of 48 bits, and is encoded into an output codeword of length 49.

First, the 48 data bits are split into six parts $D_0, D_1, \ldots, D_5$ of lengths $N_0 = 5$, $N_1 = 9$, $N_2 = 9$, $N_3 = 10$, $N_4 = 5$, and $m = N_5 = 10$, respectively. The data parts $D_0, \ldots, D_4$ are placed directly in the output codeword without encoding at bit positions 0–4, 8–16, 20–28, 32–41, and 44–48, respectively.

The last 10 data bits illustrated as $D_5$ are passed to the 10/11 encoder, which uses $D_5$ to produce an output consisting of four separators, $s_1, s_2, s_3$, and $s_4$. The output separators $s_3, s_2, s_3$, and $s_4$ have lengths $n_1 = 3$, $n_2 = 3$, $n_3 = 3$ and $n_4 = 2$, respectively.

None of the separators $s_1, s_2, s_3$, and $s_4$ consists of all zeros. Each separator $s_1, s_2$, and $s_3$ takes one of the following seven nonzero values: (0,0,1); (0,1,0); (0,1,1); (1,0,0); (1,0,1); (1,1,0); and (1,1,1). The separator $s_4$ takes one of three nonzero values: (0,1); (1,0); and (1,1). Therefore, there are total 1,029 words (7*7*7*3=1,029) of length 11 that can be used as output codewords of the 10/11 encoder 36. These codewords form the rows of the separator matrix of size 1029×11 with the following parameters:

$M = 1029$, $n = 11$, $l = 4$, $n_1 = n_2 = n_3 = 3$, $n_4 = 2$, $v_0 = 2$, $v_1 = v_2 = 4$, $v_3 = 3$, and $v_4 = 1$, and any one of the 1024 of them may be used to construct the 48/49 RLL code with $k = 13$.

In this example, the maximum number of consecutive zeros in the coded bit stream is not greater than 13. At the left boundary, data block $D_0$ has 5 bits (5 possible zeros) and separator block $s_1$ has 3 bits (2 possible zeros). At the right boundary, data block $D_4$ has 5 bits (5 possible zeros) and separator block $s_4$ has 2 bits (1 possible zero). Thus, the maximum number of consecutive zeros at the boundaries is 13.

Between $s_1$ and $s_2$, the maximum number of consecutive zeros is 13, corresponding to the 2 possible zeros from each of $s_1$ and $s_2$, and the 9 bits (9 possible zeros) associated with data block $D_1$. Between $s_2$ and $s_3$, the maximum number of consecutive zeros is 13, corresponding to the 2 possible zeros from each of $s_2$ and $s_3$, and the 9 bits (9 possible zeros) associated with $D_2$. Between $s_3$ and $s_4$, the maximum number of consecutive zeros is 13, corresponding to the 2 possible zeros from $s_3$, to the 1 possible zero from $s_4$, and to the 10 bits (10 possible zeros) associated with $D_3$. Therefore, the constructed code has the parameter $k = 13$.

The input blocks $D_5$ of the 10/11 encoder 36 consists of 10 bits, which are represented by an integer $I = 0, 1, 2, \ldots, 1023$. Here, there are 1,029 possible codewords of length 11 bits. Each codeword consists of four nonzero separators ($s_1, s_2, s_3$, and $s_4$), and 1024 of these words can be used to encode the 10 data bits as follows. Let $\Delta$ be some predefined constant ($0 \leq \Delta < 5$), and $J = I + \Delta$. By changing parameter $\Delta$, it is possible to construct 5 different versions of the encoder as follows.

| Encoding step 1 (10/11 Encoder). | | |
| --- | --- | --- |
| $s_1 = (001)$, | $h = J$, | if $0 \leq J < 147$; |
| $s_1 = (010)$, | $h = J - 147$, | if $147 \leq J < 294$; |
| $s_1 = (011)$, | $h = J - 294$, | if $294 \leq J < 441$; |
| $s_1 = (100)$, | $h = J - 441$, | if $441 \leq J < 588$; |
| $s_1 = (101)$, | $h = J - 588$, | if $588 \leq J < 735$; |
| $s_1 = (110)$, | $h = J - 735$, | if $735 \leq J < 882$; and |
| $s_1 = (111)$, | $h = J - 882$, | if $882 \leq J < 1029$. |

-continued

Encoding step 2 (10/11 Encoder).

| | | |
|---|---|---|
| $s_2 = (001)$, | $g = h$, | if $0 \leq h < 21$; |
| $s_2 = (010)$, | $g = h - 21$, | if $21 \leq h < 42$; |
| $s_2 = (011)$, | $g = h - 42$, | if $42 \leq h < 63$; |
| $s_2 = (100)$, | $g = h - 63$, | if $63 \leq h < 84$; |
| $s_2 = (101)$, | $g = h - 84$, | if $84 \leq h < 105$; |
| $s_2 = (110)$, | $g = h - 105$, | if $105 \leq h < 126$; and |
| $s_2 = (111)$, | $g = h - 126$, | if $126 \leq h < 147$. |

Encoding step 3 (10/11 Encoder).

| | | |
|---|---|---|
| $s_3 = (001)$, | $f = g$, | if $0 \leq g < 3$; |
| $s_3 = (010)$, | $f = g - 3$, | if $3 \leq g < 6$; |
| $s_3 = (011)$, | $f = g - 6$, | if $6 \leq g < 9$; |
| $s_3 = (100)$, | $f = g - 9$, | if $9 \leq g < 12$; |
| $s_3 = (101)$, | $f = g - 12$, | if $12 \leq g < 15$; |
| $s_3 = (110)$, | $f = g - 15$, | if $15 \leq g < 18$; and |
| $s_3 = (111)$, | $f = g - 18$, | if $18 \leq g < 21$ |

Encoding step 4 (10/11 Encoder).

| | |
|---|---|
| $s_4 = (01)$, | if $f = 0$; |
| $s_4 = (10)$, | if $f = 1$; and |
| $s_4 = (11)$, | if $f = 2$; |

The decoding algorithm for the 10/11 decoder is constructed as follows.

Decoding step 1.

Given separators $s_1$, $s_2$, $s_3$, and $s_4$, the integer J can be reconstructed using the following formula:

$$J = 147 * i(s_1) + 21 * i(s_2) + 3 * i(s_3) + i(s_4),$$

where $i(s)$ is an integer represented by binary word s.

Decoding step 2.

Subtracting $\Delta$ from J results in I, the binary representation of which is passed to the output of the decoder (10 bits).

As with the 7/8 encoder, the 10/11 encoder produces separator blocks for insertion into the output codeword. The separator blocks serve to limit error propagation during transmission. In this embodiment, the system 10 divides the input data bits into four parts (a, b, c, and d). The 11 output data bits are also partitioned into four corresponding parts ($s_1$, $s_2$, $s_3$, and $s_4$) of lengths $n_1 = n_2 = n_3 = 3$ and $n_4 = 2$ bits. Depending on the bits in the four input parts (a, b, c, and d), the output bits are calculated as follows.

Case 1. If $a \neq 0$, $b \neq 0$, and $c \neq 0$, then a) $s_1 = a$;

b) $s_2 = b$;

c) $s_3 = c$; and d) $s_4 = (d, \overline{d})$, where $\overline{d}$ is the binary compliment of d.

Case 2. If $a \neq 0$, $b = 0$, and $c \neq 0$, then a) $s_1 = a$;

b) $s_3 = c$;

c) $s_4 = (1,1)$.

and $s_2$ is defined by a and d according to the following replacement Table 1.

TABLE 1.

| a | | | d | | | $s_2$ | |
|---|---|---|---|---|---|---|---|
| 0 | 0 | 1 | 0 | 0 | 1 | 0 |
| 0 | 0 | 1 | 1 | 0 | 0 | 1 |
| 0 | 1 | 0 | 0 | 1 | 0 | 0 |
| 0 | 1 | 0 | 1 | 0 | 1 | 1 |
| 0 | 1 | 1 | 0 | 1 | 1 | 0 |
| 0 | 1 | 1 | 1 | 1 | 0 | 1 |
| 1 | 0 | 0 | 0 | 0 | 0 | 1 |

TABLE 1.-continued

| a | | | d | | | $s_2$ | |
|---|---|---|---|---|---|---|---|
| 1 | 0 | 0 | 1 | 1 | 1 | 1 |
| 1 | 0 | 1 | 0 | 0 | 1 | 0 |
| 1 | 0 | 1 | 1 | 0 | 1 | 1 |
| 1 | 1 | 0 | 0 | 1 | 0 | 0 |
| 1 | 1 | 0 | 1 | 1 | 0 | 1 |
| 1 | 1 | 1 | 0 | 1 | 1 | 0 |
| 1 | 1 | 1 | 1 | 1 | 1 | 1 |

Case 3. If $a = 0$, $b \neq 0$, and $c \neq 0$, then a) $s_2 = b$;

b) $s_3 = c$;

c) $s_4 = (1,1)$, and d) $s_1$ is defined by b and d according to the following replacement

TABLE 2.

| b | | | d | | | $s_1$ | |
|---|---|---|---|---|---|---|---|
| 0 | 0 | 1 | 0 | 0 | 1 | 0 |
| 0 | 0 | 1 | 1 | 1 | 1 | 1 |
| 0 | 1 | 0 | 0 | 1 | 0 | 0 |
| 0 | 1 | 0 | 1 | 1 | 1 | 0 |
| 0 | 1 | 1 | 0 | 0 | 0 | 1 |
| 0 | 1 | 1 | 1 | 0 | 1 | 1 |
| 1 | 0 | 0 | 0 | 1 | 0 | 1 |
| 1 | 0 | 0 | 1 | 1 | 1 | 1 |
| 1 | 0 | 1 | 0 | 1 | 0 | 0 |
| 1 | 0 | 1 | 1 | 0 | 1 | 0 |
| 1 | 1 | 0 | 0 | 0 | 0 | 1 |
| 1 | 1 | 0 | 1 | 1 | 1 | 0 |
| 1 | 1 | 1 | 0 | 1 | 0 | 1 |
| 1 | 1 | 1 | 1 | 0 | 1 | 1 |

Case 4. If $a = 0$, $b = 0$, and $c \neq 0$, then a) $s_3 = c$;

b) $s_4 = (1,1)$; and c) $s_1$ and $s_2$ are defined by d according to the following replacement Table 3

TABLE 3.

| $s_1$ | | | $s_2$ | | | d |
|---|---|---|---|---|---|---|
| 1 | 1 | 1 | 1 | 0 | 1 | 0 |
| 1 | 1 | 0 | 1 | 1 | 1 | 1 |

Case 5. If $a \neq 0$, $b \neq 0$, and $c = 0$, then a) $s_1 = a$;

b) $s_3 = b$;

c) $s_4 = (1,1)$, and d) $s_2$ is defined by a and d by the following replacement Table 4.

TABLE 4.

| a | | | d | | | $s_2$ | |
|---|---|---|---|---|---|---|---|
| 0 | 0 | 1 | 0 | 1 | 0 | 0 |
| 0 | 0 | 1 | 1 | 1 | 0 | 1 |
| 0 | 1 | 0 | 0 | 0 | 1 | 0 |
| 0 | 1 | 0 | 1 | 1 | 1 | 1 |
| 0 | 1 | 1 | 0 | 0 | 1 | 0 |
| 0 | 1 | 1 | 1 | 0 | 0 | 1 |
| 1 | 0 | 0 | 0 | 1 | 0 | 0 |
| 1 | 0 | 0 | 1 | 0 | 1 | 1 |

TABLE 4.-continued

| a | | | d | | | $s_2$ | |
|---|---|---|---|---|---|---|---|
| 1 | 0 | 1 | 0 | 1 | 1 | 0 | |
| 1 | 0 | 1 | 1 | 0 | 0 | 1 | |
| 1 | 1 | 0 | 0 | 0 | 0 | 1 | |
| 1 | 1 | 0 | 1 | 0 | 1 | 1 | |
| 1 | 1 | 1 | 0 | 0 | 1 | 0 | |
| 1 | 1 | 1 | 1 | 0 | 1 | 1 | |

Case 6. If a=0, b≠0, and c=0, then a) $s_4$=(1,1), and b) $s_1$, $s_2$, and $s_3$ are defined by a and d according to the following replacement Table 5.

TABLE 5

| b | | d | | $s_1$ | | | $s_2$ | | | $s_3$ | | |
|---|---|---|---|---|---|---|---|---|---|---|---|---|
| 0 | 0 | 0 | 0 | 1 | 0 | 0 | 1 | 1 | 0 | 1 | 0 | 1 |
| 0 | 0 | 0 | 1 | 1 | 0 | 0 | 1 | 1 | 0 | 1 | 1 | 0 |
| 0 | 0 | 1 | 0 | 1 | 0 | 1 | 1 | 0 | 1 | 1 | 0 | 1 |
| 0 | 0 | 1 | 1 | 1 | 0 | 1 | 1 | 0 | 1 | 1 | 1 | 0 |
| 0 | 1 | 0 | 0 | 0 | 1 | 0 | 1 | 1 | 0 | 0 | 1 | 1 |
| 0 | 1 | 0 | 1 | 0 | 1 | 0 | 1 | 1 | 0 | 1 | 0 | 0 |
| 0 | 1 | 1 | 0 | 0 | 0 | 1 | 1 | 1 | 1 | 0 | 1 | 1 |
| 0 | 1 | 1 | 1 | 0 | 0 | 1 | 1 | 1 | 1 | 1 | 1 | 0 |
| 1 | 0 | 0 | 0 | 1 | 1 | 1 | 0 | 0 | 0 | 0 | 0 | 1 |
| 1 | 0 | 0 | 1 | 0 | 1 | 1 | 1 | 0 | 0 | 0 | 1 | 0 |
| 1 | 0 | 1 | 0 | 1 | 0 | 1 | 1 | 0 | 1 | 0 | 0 | 1 |
| 1 | 0 | 1 | 1 | 0 | 1 | 0 | 1 | 0 | 1 | 0 | 1 | 0 |
| 1 | 1 | 0 | 0 | 1 | 0 | 0 | 1 | 1 | 0 | 0 | 0 | 1 |
| 1 | 1 | 0 | 1 | 1 | 0 | 0 | 1 | 1 | 0 | 0 | 1 | 0 |
| 1 | 1 | 1 | 0 | 0 | 0 | 1 | 1 | 1 | 1 | 0 | 0 | 1 |
| 1 | 1 | 1 | 1 | 0 | 0 | 1 | 1 | 1 | 1 | 0 | 1 | 0 |

Case 7. If a≠0, b=0, and c=0, then a) $s_4$=(1,1), and b) $s_1$, $s_2$, and $s_3$ are defined by a and d by the following replacement Table 6.

TABLE 6

| a | | d | | $s_1$ | | | $s_2$ | | | $s_3$ | | |
|---|---|---|---|---|---|---|---|---|---|---|---|---|
| 0 | 0 | 1 | 0 | 0 | 0 | 1 | 1 | 1 | 1 | 0 | 1 | 1 |
| 0 | 0 | 1 | 1 | 0 | 0 | 1 | 1 | 1 | 1 | 0 | 0 | 1 |
| 0 | 1 | 0 | 0 | 0 | 1 | 0 | 1 | 1 | 0 | 0 | 0 | 1 |
| 0 | 1 | 0 | 1 | 0 | 1 | 0 | 1 | 1 | 0 | 0 | 1 | 0 |
| 0 | 1 | 1 | 0 | 0 | 1 | 1 | 1 | 0 | 0 | 0 | 1 | 1 |
| 0 | 1 | 1 | 1 | 0 | 1 | 1 | 1 | 0 | 0 | 1 | 0 | 0 |
| 1 | 0 | 0 | 0 | 1 | 0 | 0 | 1 | 1 | 0 | 0 | 1 | 1 |
| 1 | 0 | 0 | 1 | 1 | 0 | 0 | 1 | 1 | 0 | 1 | 0 | 0 |
| 1 | 0 | 1 | 0 | 1 | 0 | 1 | 1 | 0 | 1 | 0 | 1 | 1 |
| 1 | 0 | 1 | 1 | 1 | 0 | 1 | 1 | 0 | 1 | 1 | 0 | 0 |
| 1 | 1 | 0 | 0 | 0 | 0 | 1 | 1 | 0 | 1 | 0 | 0 | 1 |
| 1 | 1 | 0 | 1 | 1 | 0 | 1 | 0 | 1 | 0 | 1 | 1 | 0 |
| 1 | 1 | 1 | 0 | 1 | 1 | 0 | 0 | 0 | 1 | 0 | 1 | 1 |
| 1 | 1 | 1 | 1 | 0 | 1 | 1 | 0 | 0 | 1 | 1 | 1 | 0 |

Decoding of a received encoded signal operates similar to the decoding of a 7/8 encoded signal as described with respect to FIG. 7 above. To decode a received encoded signal, the 10/11 encoder/decoder 36 divides the input codeword into four parts ($s_1$, $s_2$, $s_3$, and $s_4$) having 3 bits, 3 bits, 3 bits, and 2 bits, respectively. The output codewords of the decoder 36 consist of four parts â, b̂, ĉ and d̂ of lengths 3 bits, 3 bits, 3 bits, and 1 bit, respectively. The output words are calculated as follows.

By assigning $a_0=i(s_1)$, $b_0=i(s_2)$, and $c_0=i(s_3)$, $a_0$, $b_0$, and $c_0$ are integers representing the separators $s_1$, $s_2$, $s_3$, and $s_4$, respectively.

Case 1. If $s_4 \in \{(01),(10)\}$, then a) â=$s_1$;

b) b̂=$s_2$;

c) ĉ=$s_3$; and d) d̂ is equal to the first component of $s_4$.

Case 2. Let $T_1(i)$ be the last three bits of the i-th row of Table 1. If $s_3$=(1,1) and $s_2=T_1(a_0)$, then a) â=$s_1$;

b) b̂=(000);

c) ĉ=$s_3$; and d) d̂ is equal to the last bit of $s_2$, if $a_0 \neq 4$; and is equal to the second bit of $s_2$, if $a_0$=4.

Case 3. Let $T_2(i)$ be the last three bits of the i-th row of Table 2. If $s_3$=(1,1) and $s_1=T_2(b_0)$, then a) â=(000);

b) b̂=$s_2$;

c) ĉ=$s_3$;

d) d̂ is equal to the second bit of $s_1$, if $b_0>1$; and is equal to the last bit of $s_1$, if $b_0$=1.

Case 4. If ($a_0$=7 and $b_0$=5), or ($a_0$=6 and $b_0$=7), then a) â=(000);

b) b̂=(000);

c) ĉ=$s_3$;

d) d̂ is equal to the second bit of $s_2$.

Case 5. Let $T_4(i)$ be the last three bits of the i-th row of Table 4. If $s_4$=(1,1) and $s_4=T_2(a_0)$, then a) â=$s_1$;

b) b̂=$s_3$;

c) ĉ=(000);

d) d̂ is equal to the second bit of $s_2$, if $a_0$=6; and is equal to the last bit of $s_2$, if $a_0 \neq 6$.

Table 7 is used for decoding in cases 6 and 7 below. Let $t_7(i)$ and $T_7(i)$ represent the first and the last three bits of the i-th row of Table 7, respectively, and let $$j=3*(a_0-1)+(c_0-1-(c_0-1)\mathrm{mod}2)/2.$$

TABLE 7.

| 0 | 1 | 1 | 1 |
| 1 | 0 | 0 | 1 |
| 0 | 0 | 1 | 1 |
| 1 | 0 | 1 | 0 |
| 0 | 0 | 1 | 0 |
| 1 | 1 | 1 | 0 |
| 1 | 0 | 1 | 1 |
| 0 | 1 | 1 | 1 |
| 1 | 1 | 1 | 0 |
| 0 | 1 | 0 | 1 |
| 1 | 0 | 0 | 0 |
| 0 | 1 | 0 | 1 |
| 1 | 1 | 0 | 1 |
| 0 | 0 | 0 | 1 |

Case 6. If $s_0$=(1,1) and $t_7(j)$=0, then a) â=(000);

b) b̂=$T_7(j)$;

c) ĉ=(000); and d) d̂=$(c_0-1)\mathrm{mod}2$.

Case 7. If $s_4$=(1,1) and $t_7(j) \neq 0$, then a) â=$T_7(j)$;

b) b̂=(000);

c) ĉ=(000); and d) d̂=$(c_0-1)\mathrm{mod}2$.

While decoding has been described mathematically above, it is important to understand that the system 10 preserves the main portion of the data bits "as is", encoding only a part of the data bits for use as separator blocks. Thus, the main portion of the data bits can be permuted by the channel interleaver 20, arbitrarily, and without violating the k-constraint. The channel interleaver 20 may also permute the separator blocks formed from the part of the data bits without violating the k-constraint. Specifically, the channel interleaver 20 may permute the data bits and the separator blocks without altering the maximum number of consecutive zeros defined by the k-constraint. Thus, the system 10 may be utilized with various types of iterative detection schemes based on turbo codes, LDPC codes, and other similar coding schemes. Moreover, the separator blocks limit error propagation.

Figure 9:
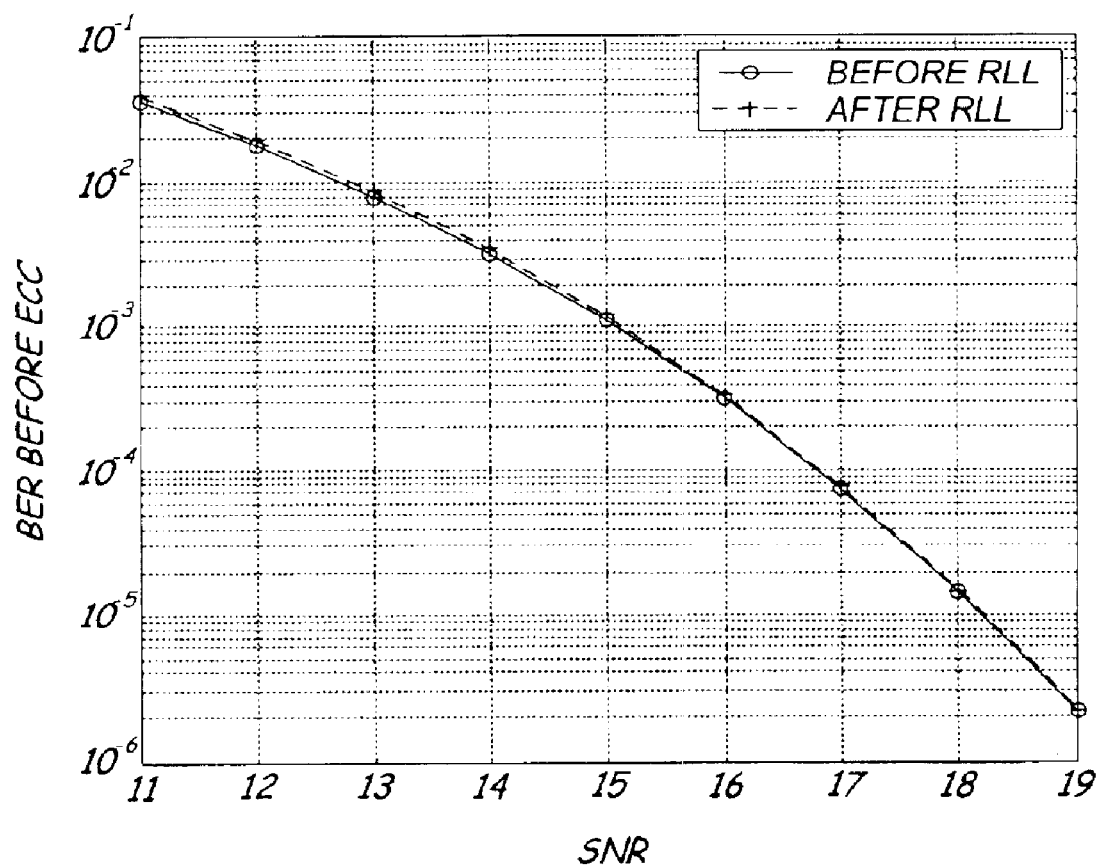
FIG. 9 is a graph of the bit error rates (BER) versus signal to noise ratio (SNR) of a stuffed 48/49 RLL code having a k-constraint of 13 both before and after RLL decoding with ND=2.5 and no jitter.

FIG. 9–17 illustrate the BER and SFR characteristics of the 48/49 RLL code with k=13 construct by stuffing of 4 separators in the data stream. FIG. 9 shows a graph of the bit error rates (BERs) before and after the RLL decoder of the present invention and before Error Correction Coding. Using a code rate of 48/49 with a k-constraint of 13, and a GPR target of length 5 and an ND of 2.5 (and no jitter), the system 10 provided an output code before and after the RLL decoder with a very small error propagation. Specifically, the before and after RLL lines are almost on top of one another.

Figure 10:
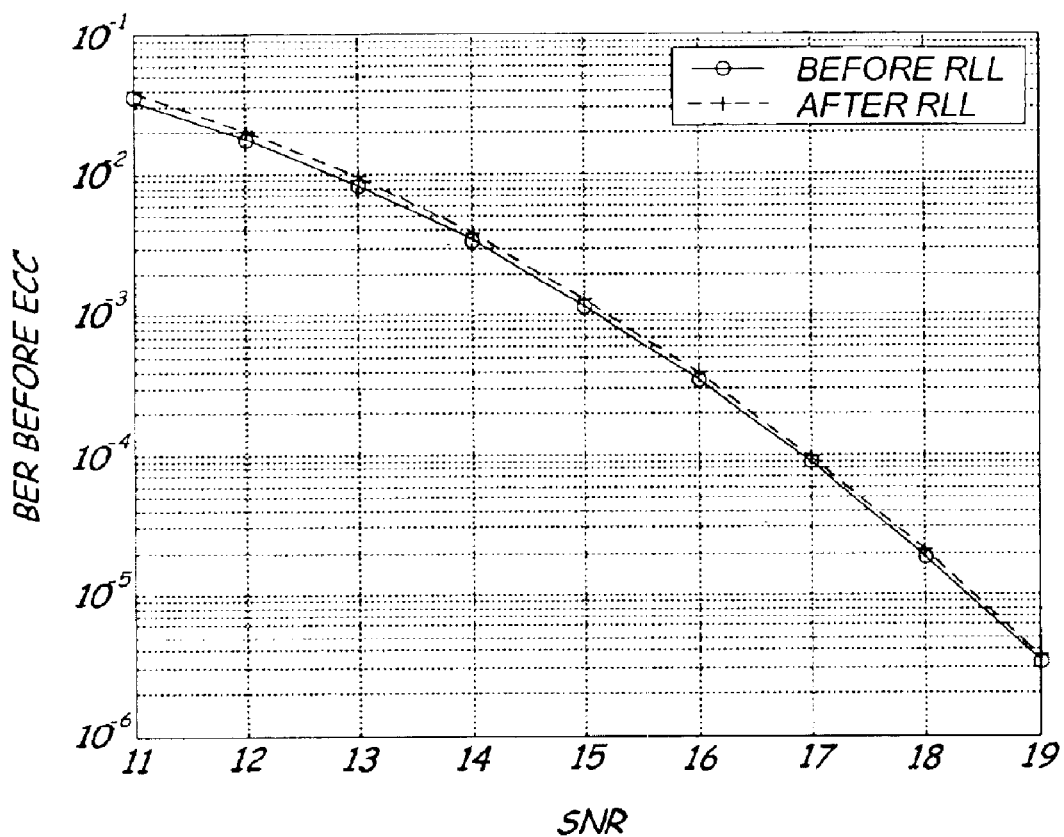
FIG. 10 is a graph of the BER versus SNR of a conventional 48/49 RLL code having a k-constraint of 13 both before and after RLL decoding with ND=2.5 and no jitter.

FIG. 10 illustrates the BERs of the same RLL code before and after decoding with a conventional RLL decoder. As shown, bit errors are propagated by conventional RLL decoders. Specifically, the before RLL and after RLL graph lines do not overlap, and the after RLL decoder graph line shows a higher bit error rate than the line showing the signal before the RLL decoder is used.

Figure 11:
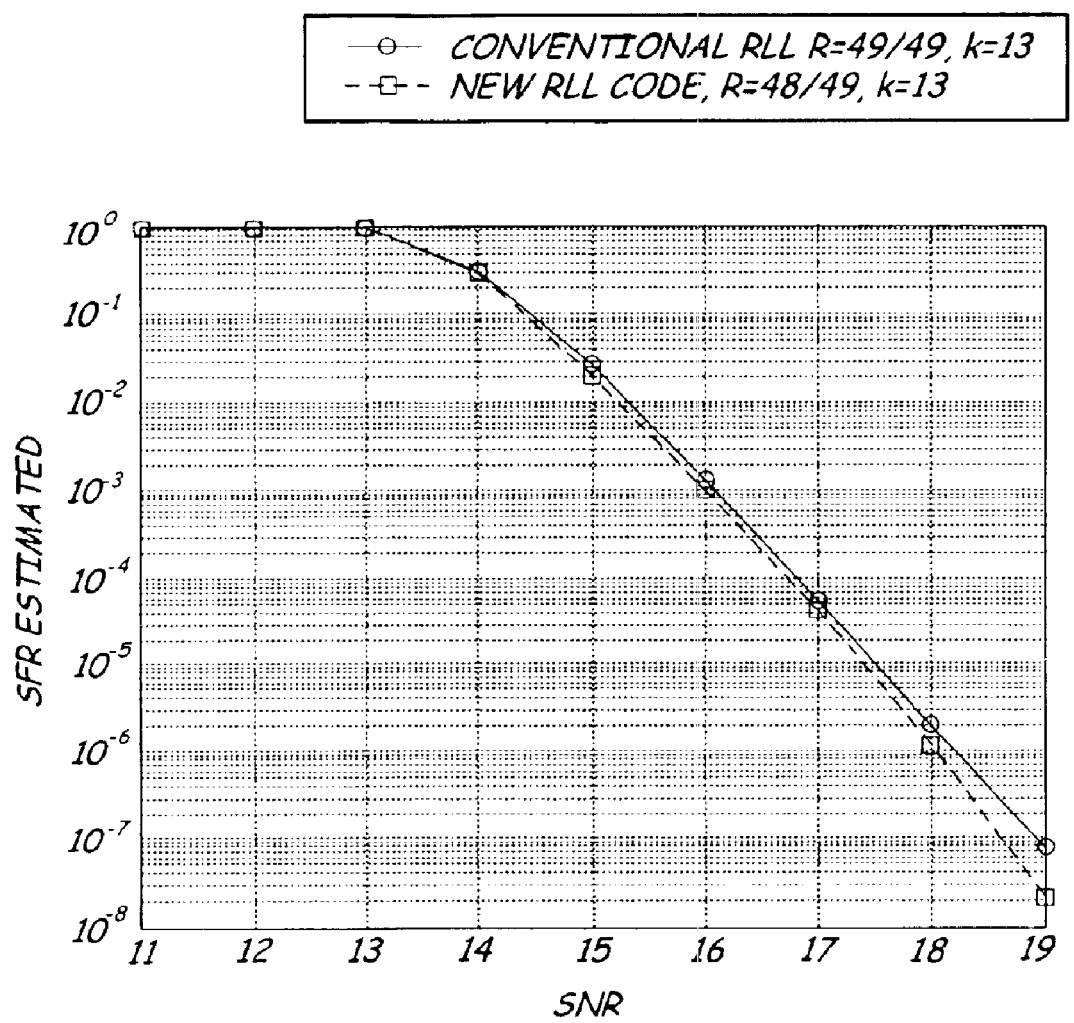
FIG. 11 is a graph of the sector failure rates versus SNR for conventional RLL codes and for stuffed RLL codes of the present invention in a channel with ND=2.5 and no jitter.

FIG. 11 illustrates the conventional RLL code as compared with the RLL code of the present invention. Both the conventional and the new RLL code have a code rate of 48/49 and a k-constraint of 13. As shown, with no jitter, the new RLL code of the present invention has a better sector failure rate than the conventional RLL code, particularly at higher signal to noise ratios.

For example, at a signal to noise ratio of 19, the new RLL code has a sector failure rate of $2 \times 10^{-8}$ as compared to $8.5 \times 10^{-8}$ of the conventional RLL code. In data storage and retrieval systems, such error rate improvements are significant.

Figure 12:
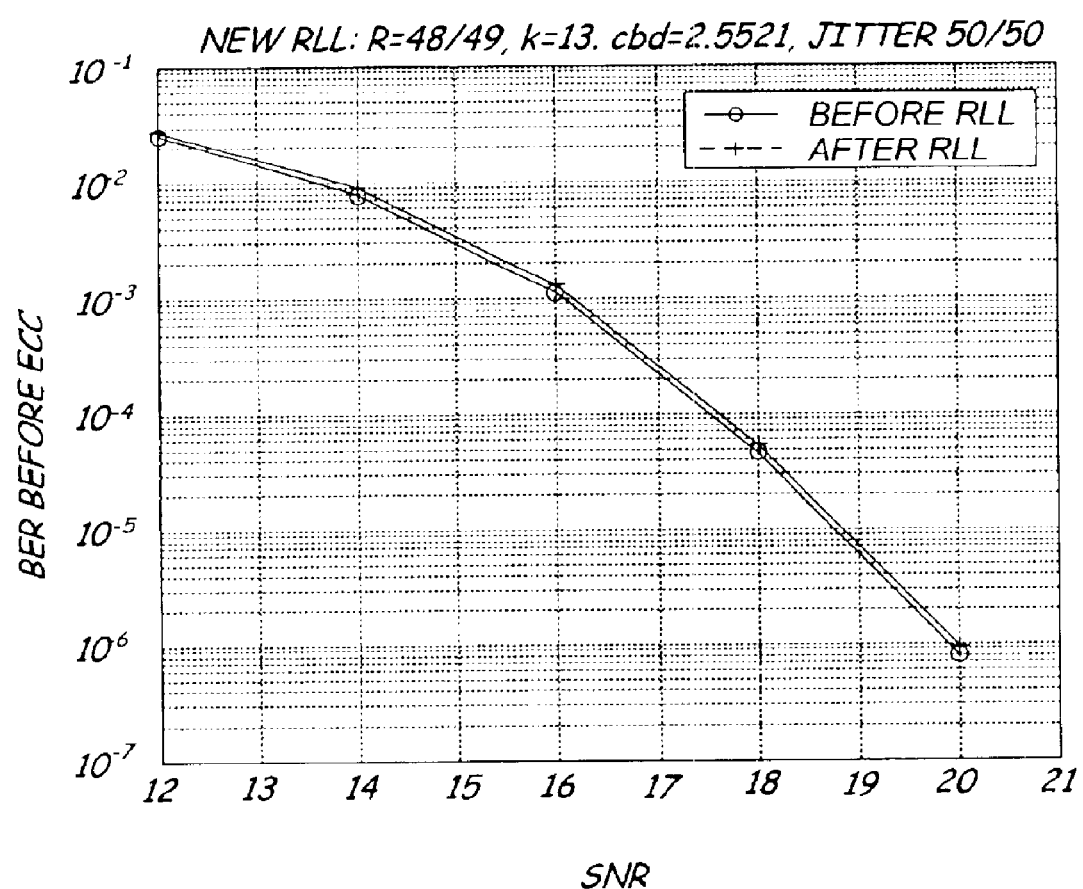
FIG. 12 is a graph of the BER versus SNR of a stuffed 48/49 RLL code having a k-constraint of 13 both before and after RLL decoding with ND=2.5 and 50% jitter.
Figure 13:
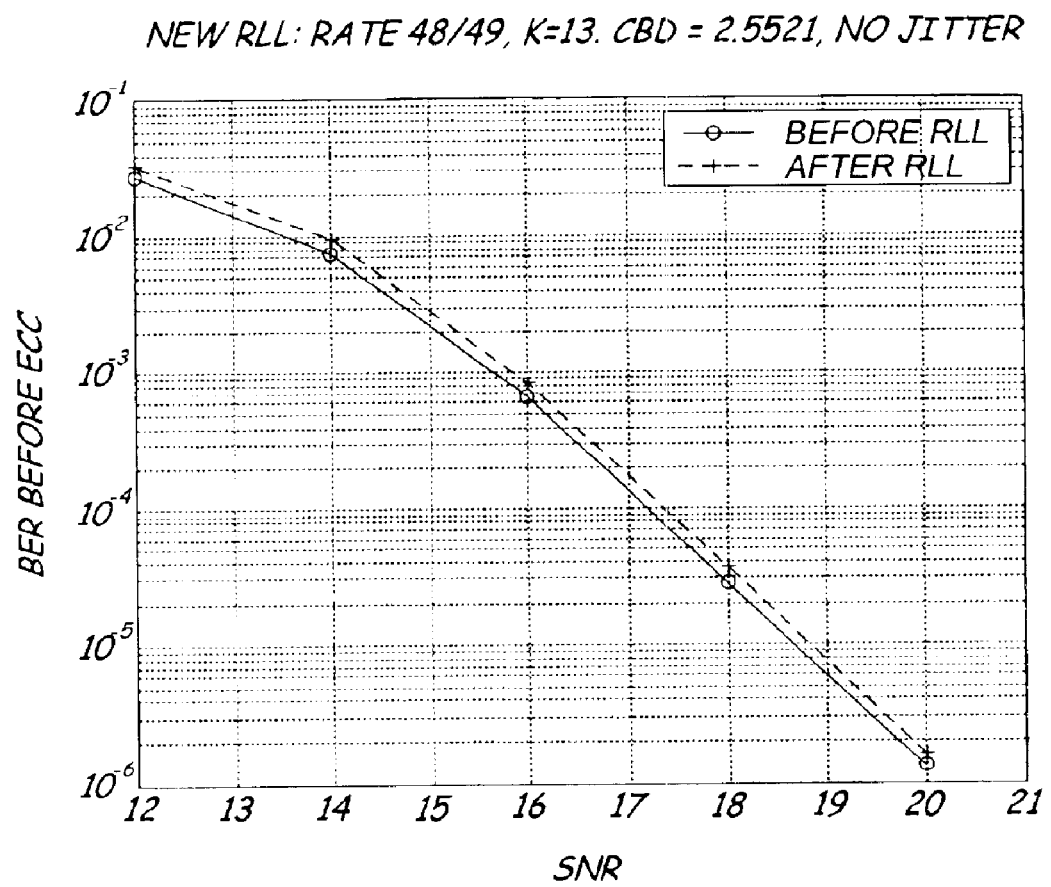
FIG. 13 is a graph of the BER versus SNR of a conventional 48/49 RLL code having a k-constraint of 13 both before and after conventional RLL decoding with ND=2.5 and 50% jitter.

FIGS. 12 and 13 illustrate the BERs of the new RLL code as compared with the conventional RLL code, both before and after the RLL decoder. As shown, both the new and the conventional RLL codes tested had a code rate of 48/49, a k-constraint of 13, a GPR target of length 5, a ND of 2.5, and 50/50 jitter. In FIG. 12, the BERs before and after RLL decoding are almost identical, indicating that there is very little error propagation during the decoding process. In FIG. 13, by contrast, there is a visible difference between the graphs showing before and after RLL decoding. Specifically, at every data point, the line showing after RLL decoding is visibly worse than the graph of the before RLL decoding. At a signal to noise ratio of 12, for example, the bit error rate is $2.5 \times 10^{-2}$ before the RLL decoder versus $3 \times 10^{-2}$ after the RLL decoder.

Figure 14:
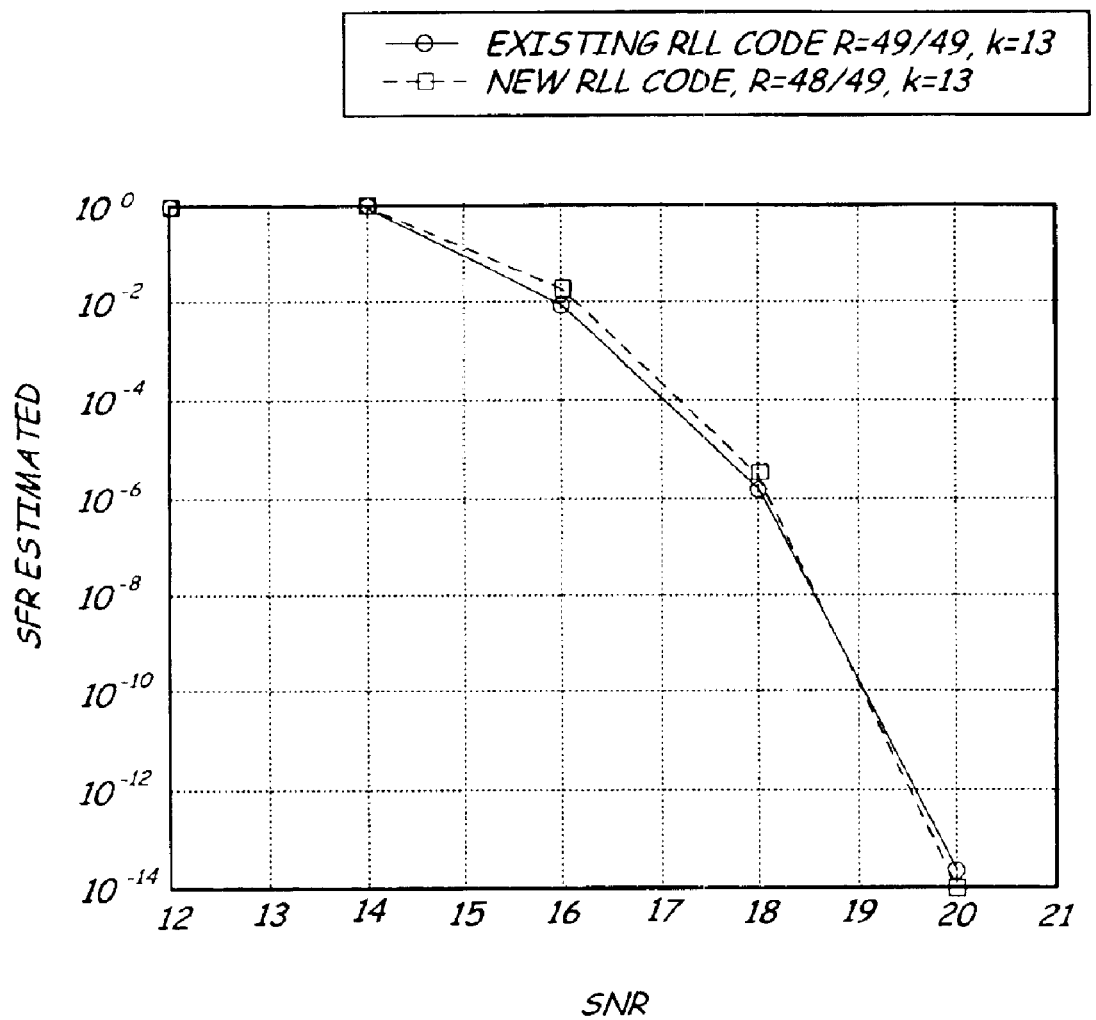
FIG. 14 is a graph of the sector failure rates versus SNR for conventional RLL codes and for stuffed RLL codes of the present invention in a longitudinal channel with 50% jitter and 50% electronic noise.

FIG. 14 illustrates the sector failure rates of the conventional RLL code versus the new RLL code of the present invention. Here, the code rate was 48/49 and the k-constraint was 13. The data was written in a longitudinal channel with a GPR target of length 5. Noise consisted of 50% jitter and 50% electronic noise. As shown, the sector failure rates are approximately the same between the conventional RLL code and the RLL code of the present invention, and at high signal to noise ratios (such as 20), then RLL code of the present invention slightly out-performs the conventional RLL code. It is significant that the RLL code of the present invention performs as well as the conventional code with respect to the sector failure rate, since noticeable degradation in the sector failure rate would be intolerable.

Figure 15:
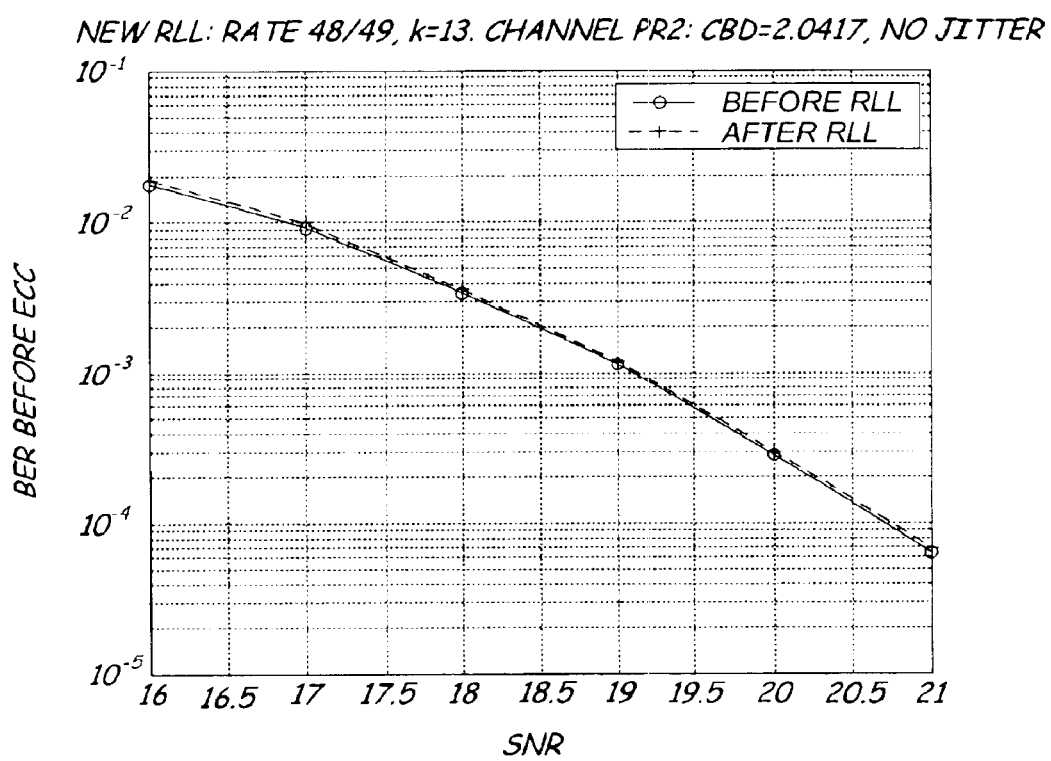
FIG. 15 is a graph of the BER versus SNR of the stuffed 48/49 RLL code in a PR2 channel with ND=2.0 and no jitter.
Figure 16:
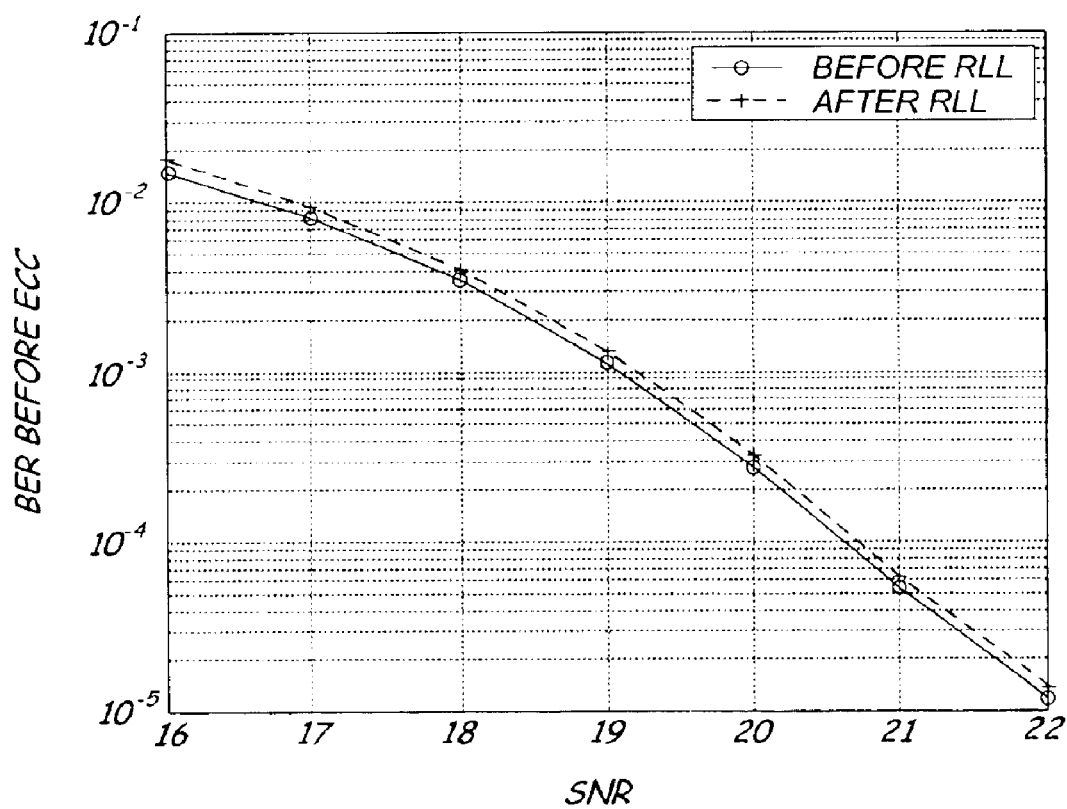
FIG. 16 is a graph of the BER versus SNR of the conventional RLL code in a PR2 channel with ND=2.0 and no jitter.

FIGS. 15 and 16 illustrate the BERs of the new RLL code as compared with the conventional RLL code, before and after decoding using the RLL decoder in perpendicular magnetic recording. In both cases, the RLL code had a code rate of 48/49 and a k-constraint of 13. FIG. 15 once again demonstrates a very small error propagation between the before and after graphs of the invented code. By contrast, FIG. 16 shows a visible separation between the graphs of the BER before and after RLL decoding.

Figure 17:
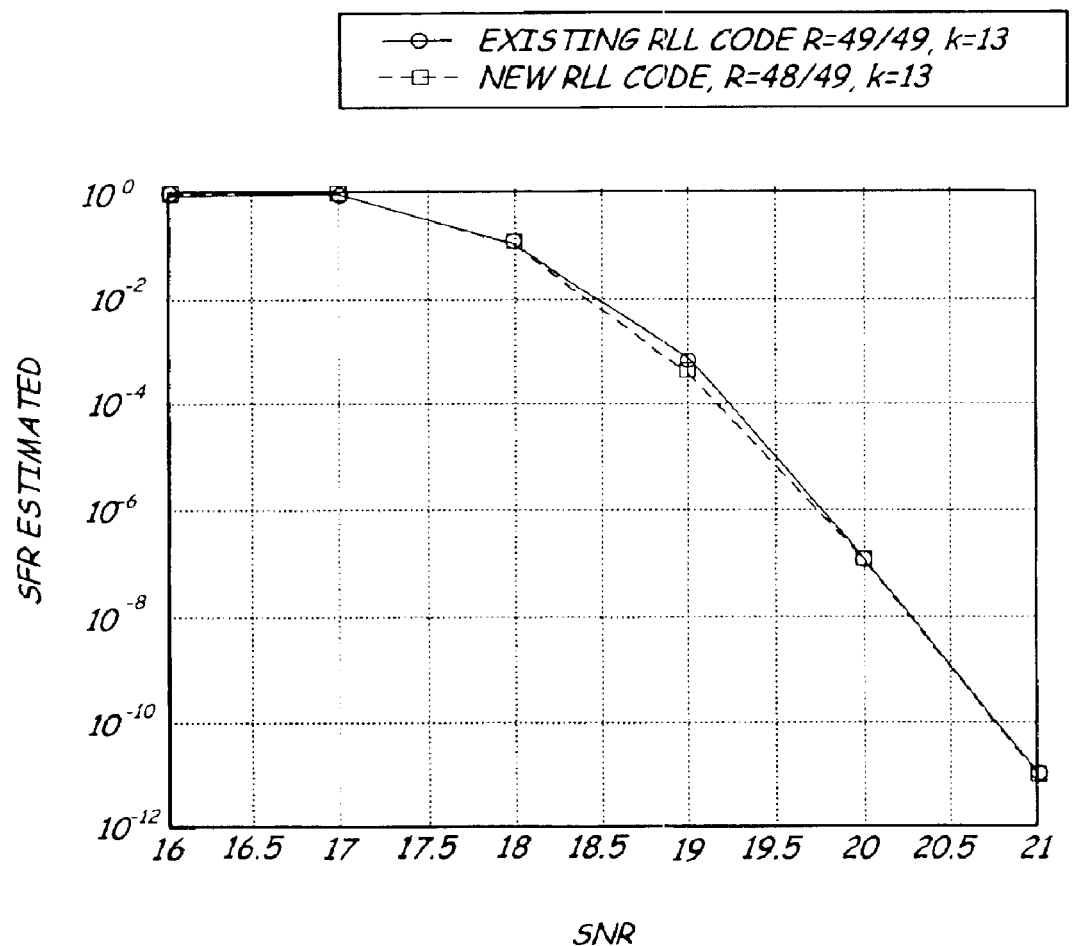
FIG. 17 is a graph of the sector failure rates versus SNR for conventional RLL codes and for stuffed RLL codes of the present invention in a PR2 channel with ND=2.0 and no jitter.

FIG. 17 illustrates the sector failure rate of the conventional RLL codes and the RLL codes of the present invention, with a code rate of 48/49 and a k-constraint of 13. Here, the sector failure rates are approximately equal, with the RLL code of the present invention slightly outperforming the conventional RLL code at a signal to noise ratio between 18.5 and 19.5.

The code stuffing technique of the present invention, while described with respect to 7/8 and 48/49 encoders, may be implemented using other code rates and with different encoders. Regardless of the encoder and the code rate, the system 10 divides the input codeword into parts and encodes one of the parts to form separator bits for stuffing between the remaining, unencoded parts of the input code word to form an output code word. This allows for the use of Interleavers/permuters for randomly reordering the bits, without effecting the k-constraint and without allowing errors to propagate throughout the output codeword.

Although the present invention has been described with reference to preferred embodiments, workers skilled in the art will recognize that changes may be made in form and detail without departing from the spirit and scope of the invention.

What is claimed is:

1. A method of forming RLL coded data streams comprising:
    dividing an input codeword into data portions and a separator portion;
    placing the data portions into an output codeword with spaces between the data portions;
    producing a separator matrix from the separator portion, the separator matrix being composed of a plurality rows, each row being a separator sub-matrix of ones and zeros such that each row is nonzero; and
    stuffing a respective one of the plurality of rows into a respective one of the spaces between the data portions of the input codeword to form the output codeword.

2. The method of claim 1 wherein separator sub-matrices prevent the output codeword from having more than a predetermined number of consecutive zeros.

3. The method of claim 1 wherein the step of producing comprises:
    passing the separator portion to an encoder to produce an encoded separator portion; and
    generating separator blocks of a predetermined bit size from the encoded separator portion.

4. The method of claim 1 wherein the data portions of the input codeword are placed directly into the output codeword without encoding.

5. The method of claim 1 wherein the data portions of the input codeword are groups of bits, each group having a predetermined number of bits.

6. The method of claim 1 further comprising:

interleaving the separator sub-matrices without changing boundaries between the separator sub-matrices prior to stuffing.

7. The method of claim 1 further comprising:

changing an order of data portions of equal size within the output codeword without changing boundaries between data portions.

8. A method of forming RLL coded data streams, the method comprising:

separating an input data block into data blocks, each data block having one or more data bits;

dividing one of the data blocks into a plurality of sets of data, each set having a predetermined number of bits;

encoding the sets of data in an encoder to form separator blocks; and forming an output code word from the data blocks and the separator blocks such that the separator blocks are positioned between the data blocks within the codeword.

9. The method of claim 8, wherein each RLL coded data stream has a code rate of 10/11 and a k-constraint of no more than 12 consecutive zeros.

10. The method of claim 8 further comprising:

permuting the separator blocks after encoding.

11. The method of claim 8 further comprising:

permuting the data blocks and the separator blocks separately before forming the output code word.

12. The method of claim 8 wherein a binary value of each separator block is greater than zero.

13. The method of claim 8 wherein a code rate of the RLL coded data stream is 48/49.

14. A system for producing a coded data stream having consecutive one values separated by a separator block, the system comprising:

an RLL encoder adapted to separate an input code word into data portions and a separator portion, the RLL encoder adapted to place the data portions into an output codeword with spaces between the data portions;

an encoder block adapted to process the separator portion into a separator matrix and adapted to place a respective one of the rows of the separator matrix into a respective one of the spaces between the data portions in the output codeword; and a transceiver adapted to transmit the output codeword to a channel.

15. The system of claim 14, further comprising:

front end and timing elements for filtering data read from the channel;

a decoder block for processing the output codeword into data portions and rows of the separator matrix and for decoding the separator matrix; and a RLL decoder for decoding the data portions.

16. The system of claim 14 wherein the system is a disc drive.

17. The system of claim 14 and further comprising:

an interleaver adapted to process the output codeword prior to transmission by the transceiver.

18. The system of claim 17 wherein the output codeword is interleaved without changing boundaries between the data portions in the output codeword.

19. A method for encoding data for transmission over a channel, the method comprising:

breaking an input codeword into n data portions and a separator portion;

placing the data portions into an output codeword without encoding, each data portion being separated from a next data portion by a space;

encoding the separator portion into n minus 1 separator blocks; and placing a respective one of the n minus 1 separator blocks into a respective one of the spaces between the data portions in the output codeword.

20. The method of claim 19 further comprising:

writing the output codeword to the channel.

21. The method of claim 19 wherein one separator block of the n minus 1 separator blocks has a fewest number of bits compared with other separator blocks, the step of placing the separator blocks further comprising:

placing the one separator block having the fewest number of bits between data portion (n) and data portion (n−1).

22. The method of claim 19 and further comprising:

permuting the n minus 1 separator blocks with a first encoder, and permuting the n data blocks with a second encoder.

23. The method of claim 19 further comprising:

detecting transmitted data using an iterative detection scheme.

* * * * *